(12) United States Patent  
Masuda

(10) Patent No.: US 8,884,849 B2
(45) Date of Patent: Nov. 11, 2014

(54) DISPLAY PANEL AND PRODUCTION METHOD THEREOF

(75) Inventor: Hiroyuki Masuda, Osaka (JP)

(73) Assignee: Panasonic Corporation, Osaka (JP)

( * ) Notice: Subject to any disclaimer, the term of this patent is extended or adjusted under 35 U.S.C. 154(b) by 127 days.

(21) Appl. No.: 13/561,211

(22) Filed: Jul. 30, 2012

(65) Prior Publication Data

US 2012/0287026 A1    Nov. 15, 2012

Related U.S. Application Data

(63) Continuation of application No. PCT/JP2011/004074, filed on Jul. 19, 2011.

(30) Foreign Application Priority Data

Jul. 23, 2010 (JP) ................................. 2010-165922
Aug. 26, 2010 (JP) ................................. 2010-189466

(51) Int. Cl.
*G09G 3/30* (2006.01)
*H01L 27/32* (2006.01)
*H01L 51/52* (2006.01)

(52) U.S. Cl.
CPC ........ *H01L 51/5246* (2013.01); *H01L 27/3272* (2013.01)
USPC .......................................................... 345/76

(58) Field of Classification Search
CPC ............... G02F 1/1339; G02F 1/1341; G02F 2201/503; G02F 2202/28; H01L 51/5246; H01L 51/525; H01L 2227/323; H01L 27/3272
USPC ........... 345/76, 205; 156/272.8, 275.1, 275.5, 156/275.7
See application file for complete search history.

(56) References Cited

U.S. PATENT DOCUMENTS 5,381,255 A * 1/1995 Ohnuma et al. ............... 349/106
6,151,090 A * 11/2000 Tanaka et al. ................. 349/134
(Continued)

FOREIGN PATENT DOCUMENTS

CN    101179113    5/2008
CN    101711438    5/2010
(Continued)

OTHER PUBLICATIONS

U.S. Appl. No. 13/502,662 to Tsugihiro Matsuda et al., filed Apr. 18, 2012.

(Continued)

*Primary Examiner* — Tom Sheng
(74) *Attorney, Agent, or Firm* — Greenblum & Bernstein, P.L.C.

(57) ABSTRACT

A display panel includes: a first substrate; light-emitting elements on a region of the first substrate; a second substrate facing the first substrate with the light-emitting elements therebetween; a glass frit between the first substrate and the second substrate so as to surround the region of the first substrate in which the light-emitting elements are disposed, the glass frit providing a hermetic seal between the first substrate and the second substrate; and a light-shielding part formed on one of the first substrate and the second substrate so as to extend along the glass frit, the light-shielding part shielding light. The light-shielding part has a lower light-shielding property in a region corresponding to the outer region of the glass frit than in a region corresponding to the inner region of the glass frit. The glass frit has been irradiated with light through the light-shielding part.

31 Claims, 23 Drawing Sheets

(56) References Cited

U.S. PATENT DOCUMENTS

| | | |
|---|---|---|
| 7,385,347 B2 | 6/2008 | Song et al. |
| 7,652,305 B2 | 1/2010 | Chatterjee et al. |
| 7,659,663 B2 | 2/2010 | Kwak |
| 7,800,303 B2 | 9/2010 | Logunov et al. |
| 7,862,396 B2 | 1/2011 | Lee |
| 8,128,449 B2 | 3/2012 | Cha |
| 8,134,293 B2 | 3/2012 | Logunov et al. |
| 8,174,179 B2 | 5/2012 | Suh |
| 8,187,754 B2 | 5/2012 | Sano et al. |
| 8,551,804 B2 | 10/2013 | Hori et al. |
| 2004/0165120 A1* | 8/2004 | Woo et al. .................. 349/42 |
| 2004/0258921 A1* | 12/2004 | Watanabe et al. ........... 428/413 |
| 2006/0125981 A1* | 6/2006 | Okuda ....................... 349/110 |
| 2007/0170856 A1 | 7/2007 | Cha |
| 2007/0176550 A1 | 8/2007 | Kwan |
| 2007/0188079 A1 | 8/2007 | Song et al. |
| 2007/0195634 A1 | 8/2007 | Lee |
| 2008/0090149 A1 | 4/2008 | Sano et al. |
| 2008/0106194 A1 | 5/2008 | Logunov et al. |
| 2008/0206925 A1* | 8/2008 | Chatterjee et al. ........... 438/106 |
| 2008/0213482 A1 | 9/2008 | Logunov |
| 2008/0250952 A1* | 10/2008 | Kubota et al. ............... 101/126 |
| 2009/0174630 A1* | 7/2009 | Chan et al. .................. 345/76 |
| 2009/0231524 A1 | 9/2009 | Tanaka |
| 2009/0308105 A1 | 12/2009 | Pastel et al. |
| 2010/0007270 A1 | 1/2010 | Suh |
| 2011/0001424 A1 | 1/2011 | Logunov et al. |
| 2011/0175118 A1 | 7/2011 | Hori et al. |
| 2012/0080671 A1 | 4/2012 | Niboshi et al. |
| 2012/0217521 A1 | 8/2012 | Ohta |
| 2012/0218173 A1 | 8/2012 | Ohta et al. |
| 2012/0223873 A1 | 9/2012 | Ohta |

FOREIGN PATENT DOCUMENTS

| | | |
|---|---|---|
| JP | 2004-272195 | 9/2004 |
| JP | 2004-327197 | 11/2004 |
| JP | 2007-053030 | 3/2007 |
| JP | 2007-200834 | 8/2007 |
| JP | 2007-200849 | 8/2007 |
| JP | 2007-220647 | 8/2007 |
| JP | 2007-220648 | 8/2007 |
| JP | 2008-117767 | 5/2008 |
| JP | 2009-196859 | 9/2009 |
| JP | 2010-080224 | 4/2010 |
| JP | 2010-129348 | 6/2010 |
| JP | 2010-520142 | 6/2010 |
| KR | 2009-0122260 | 11/2009 |
| KR | 2010-0007265 | 1/2010 |
| WO | 2007/086159 | 8/2007 |
| WO | 2008/106123 | 9/2008 |
| WO | 2009/151592 | 12/2009 |
| WO | 2010/143337 | 12/2010 |

OTHER PUBLICATIONS

U.S. Appl. No. 13/603,242 to Tsugihiro Matsuda et al., filed Apr. 20, 2012.

International Search Report in PCT/JP2011/004074, dated Oct. 25, 2011.

China Office Action from State Intellectual Property Office (SIPO) in Chinese Patent Application No. 201180009213.5, dated Jul. 3, 2014, together with a partial English language translation.

* cited by examiner

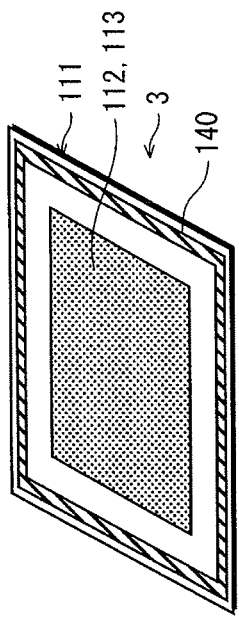
FIG. 3A Preparing EL substrate 2
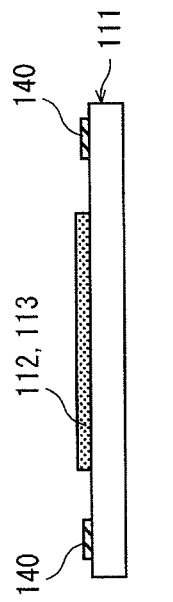
FIG. 3B Preparing CF substrate 3
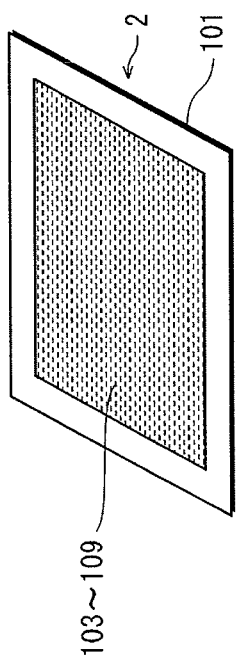
FIG. 3C Applying bounding seal (DAM)
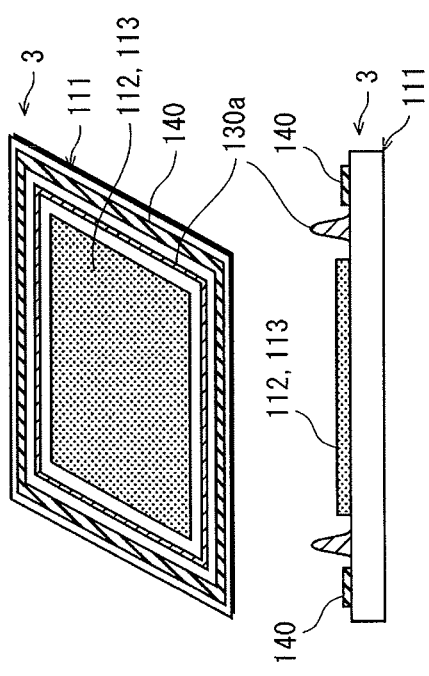
FIG. 3D Applying encapsulating resign (filling)

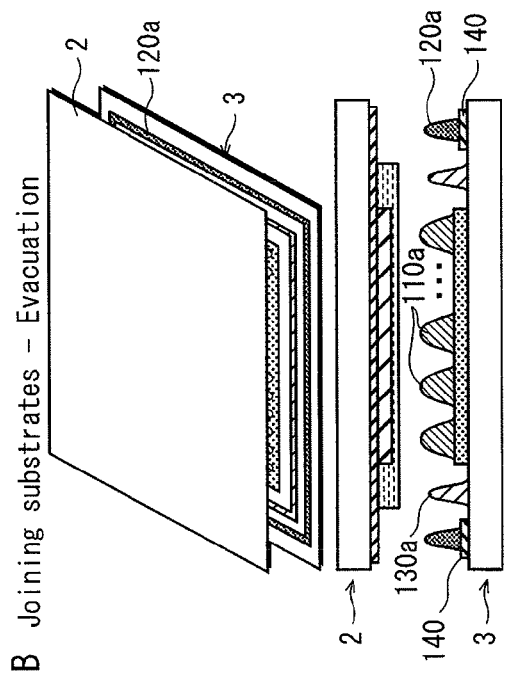
FIG. 4A Applying glass frit paste
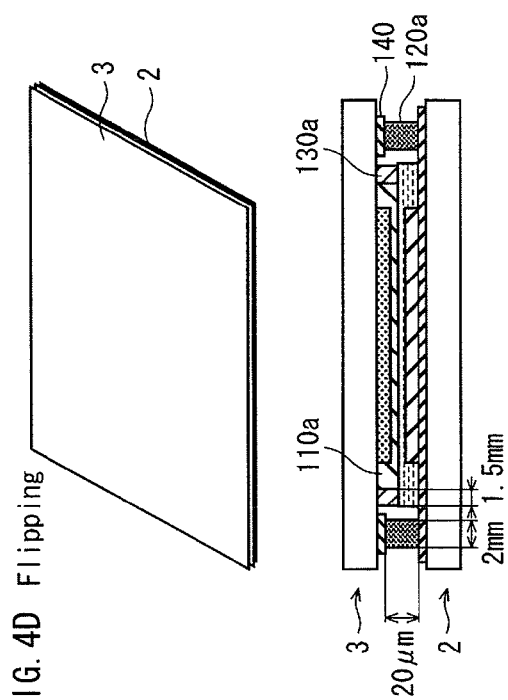
FIG. 4B Joining substrates - Evacuation
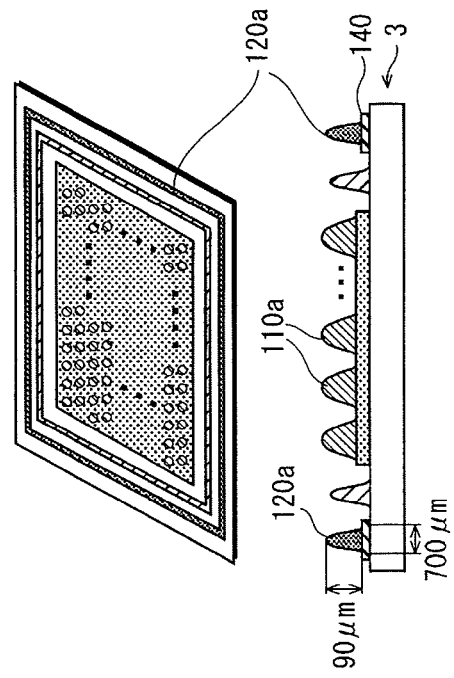
FIG. 4C Vacuum sealing
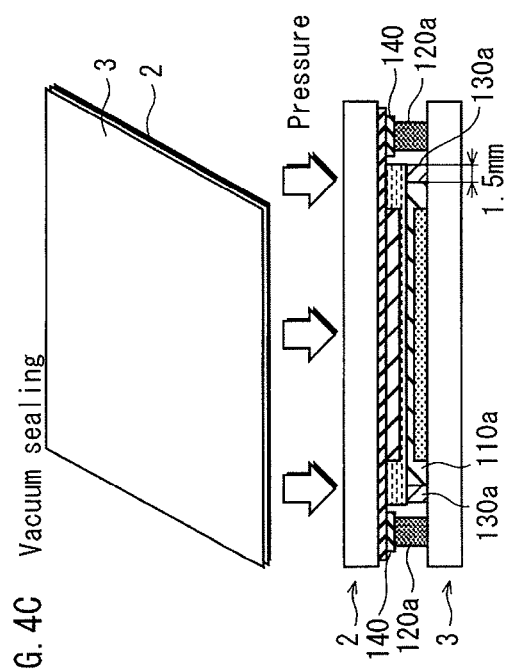
FIG. 4D Flipping

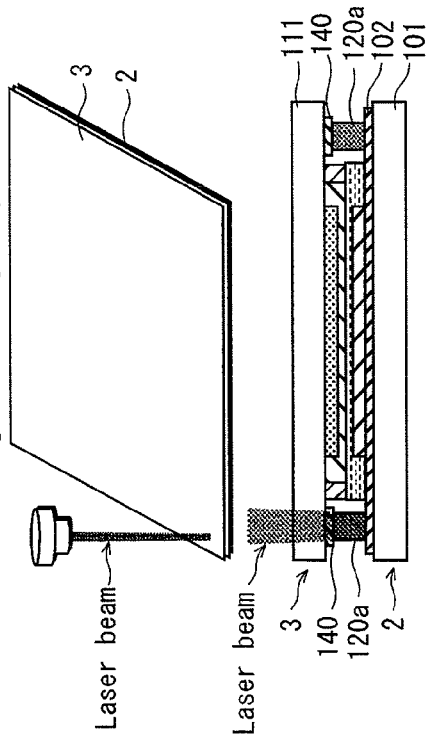
FIG. 5A UV + heat curing
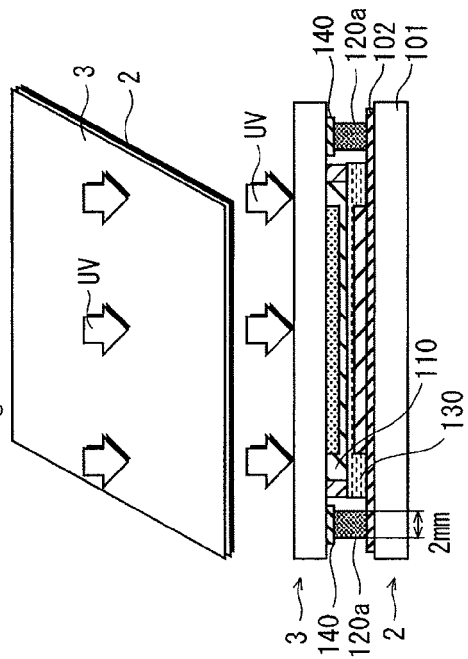
FIG. 5B Desolventizing & debinding of glass frit (pre-baking)
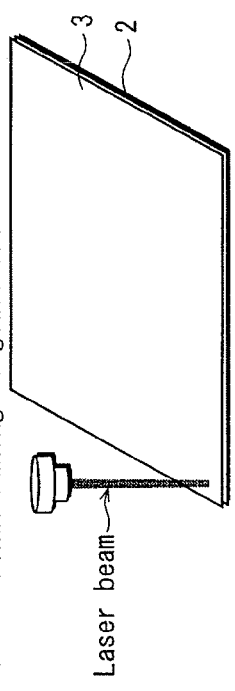
FIG. 5C Final baking of glass frit
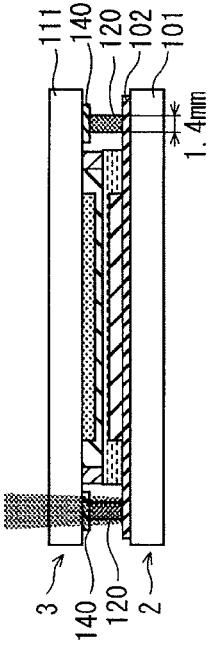
FIG. 5D Completion Desolventizing & debinding of glass frit (pre-baking)

FIG. 15A
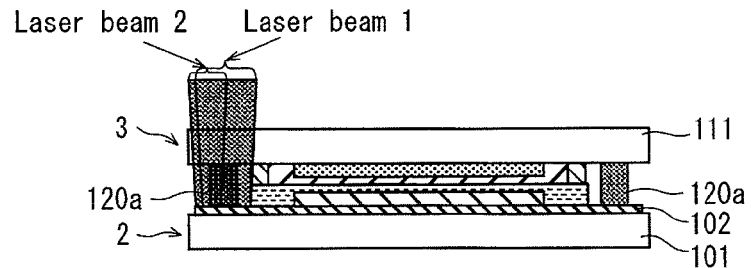
FIG. 15B
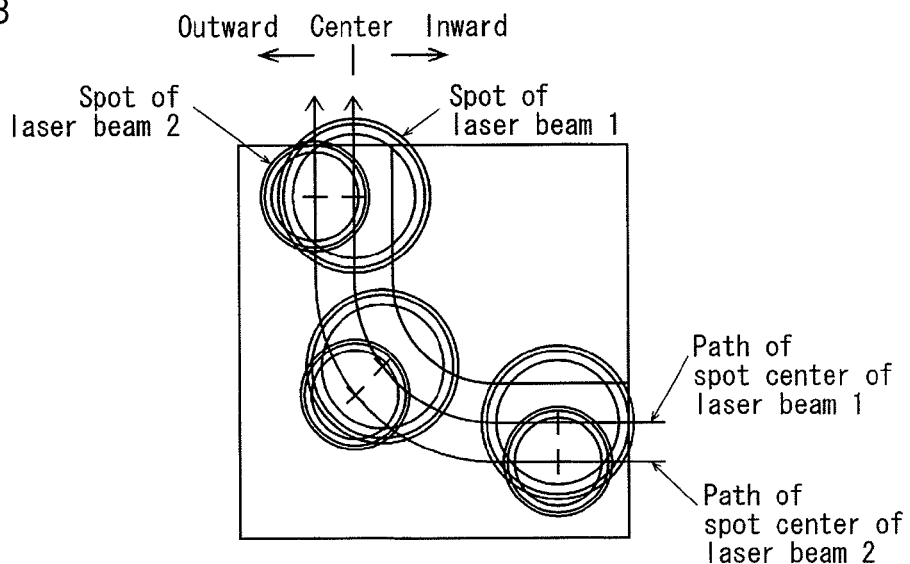
FIG. 15C Intensity distribution of laser beam 1
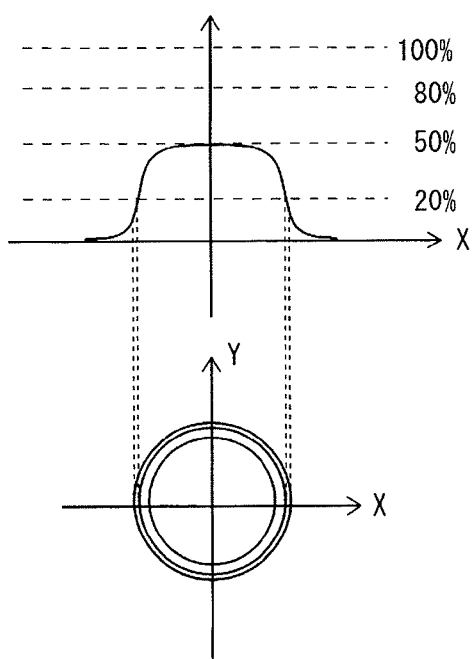
FIG. 15D Intensity distribution of laser beam 2
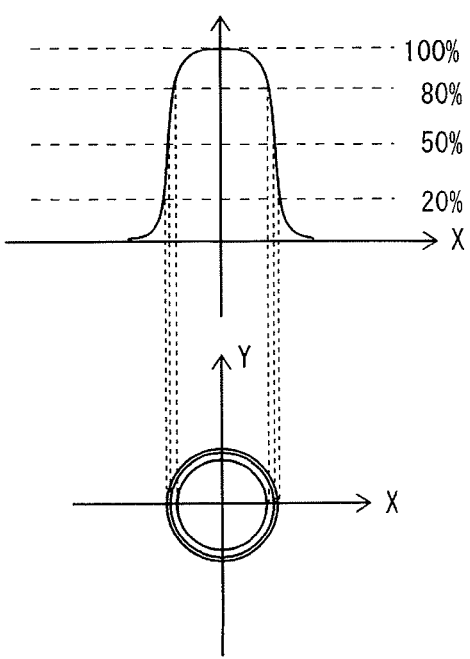

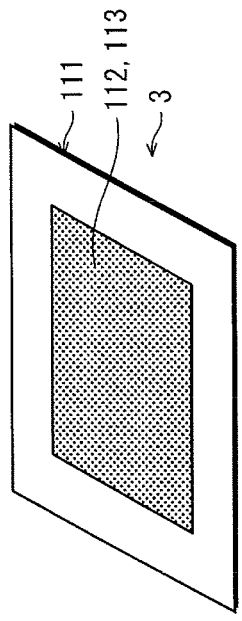
FIG. 18A Preparing EL substrate 2
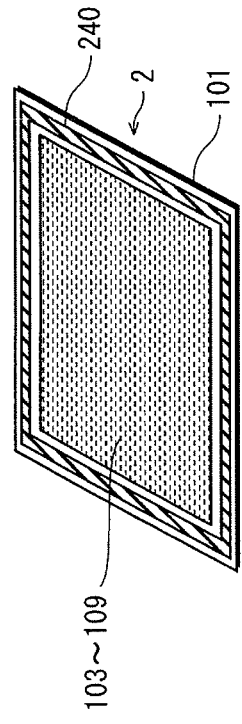
FIG. 18B Preparing CF substrate 3
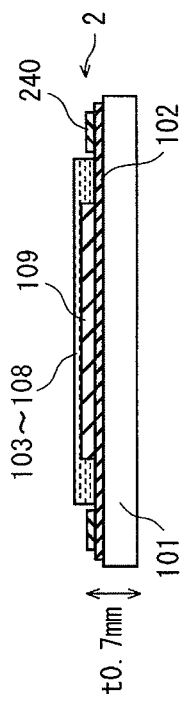
FIG. 18C Applying bounding seal (DAM)
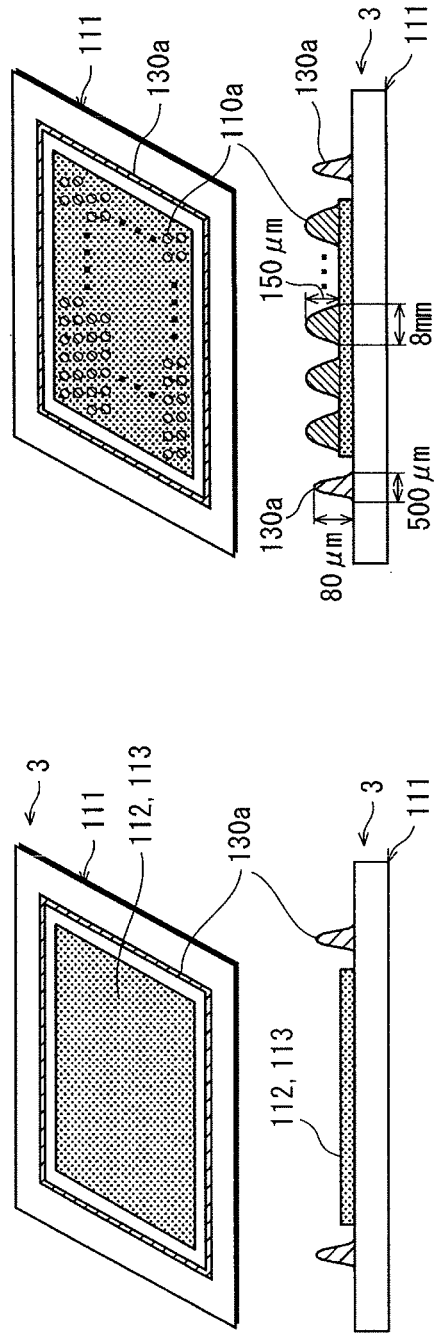
FIG. 18D Applying encapsulating resign (filling)

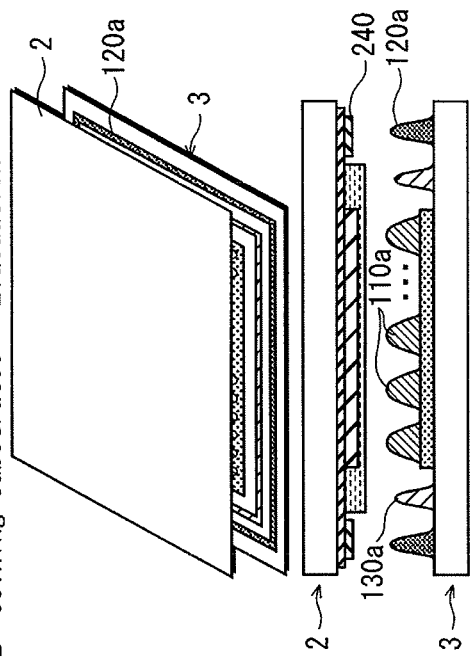
FIG. 19A Applying glass frit paste
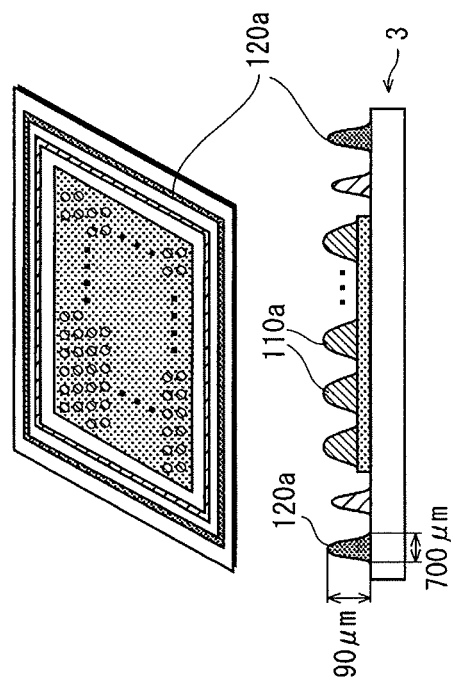
FIG. 19B Joining substrates - Evacuation
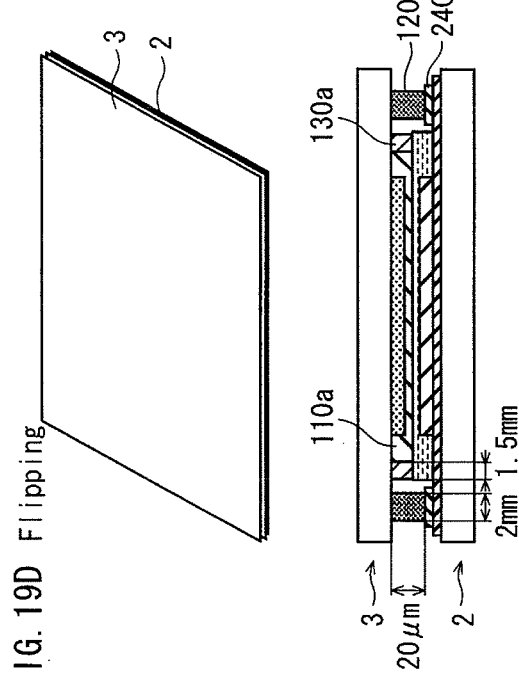
FIG. 19C Vacuum sealing
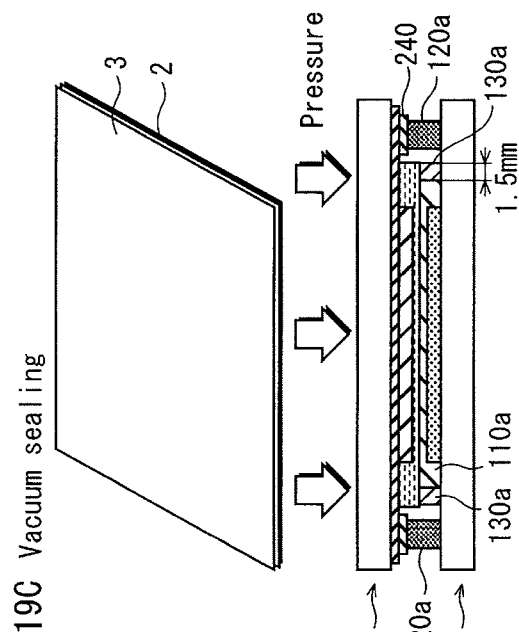
FIG. 19D Flipping

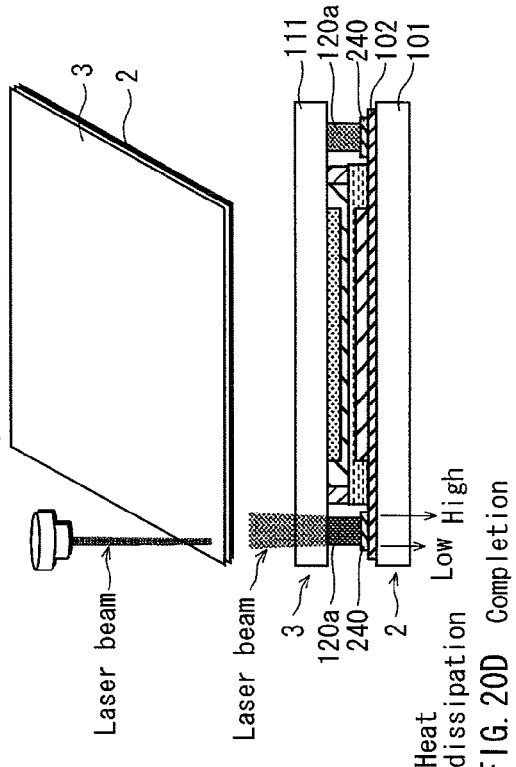
FIG. 20A UV + heat curing
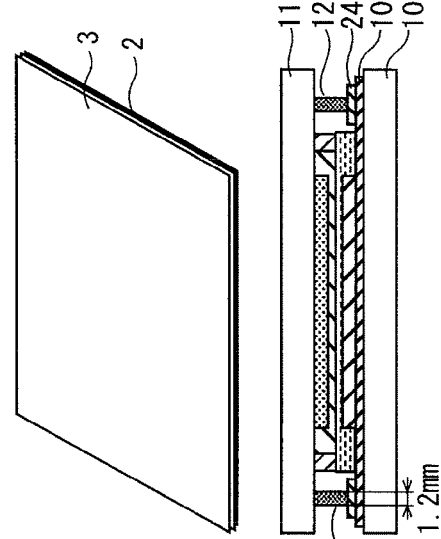
FIG. 20B Desolventizing & debinding of glass frit (pre-baking)
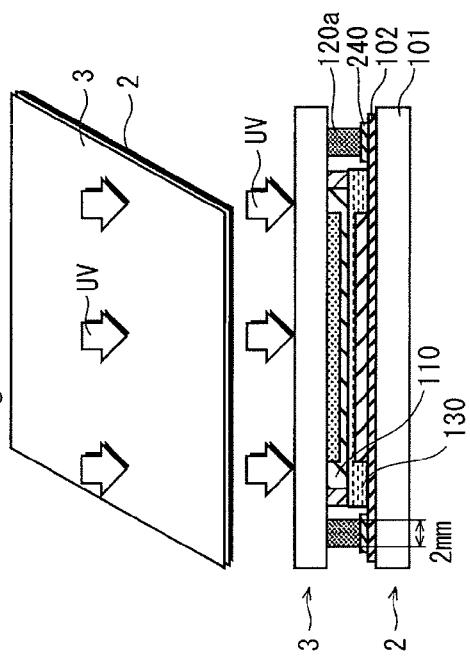
FIG. 20C Final baking of glass frit
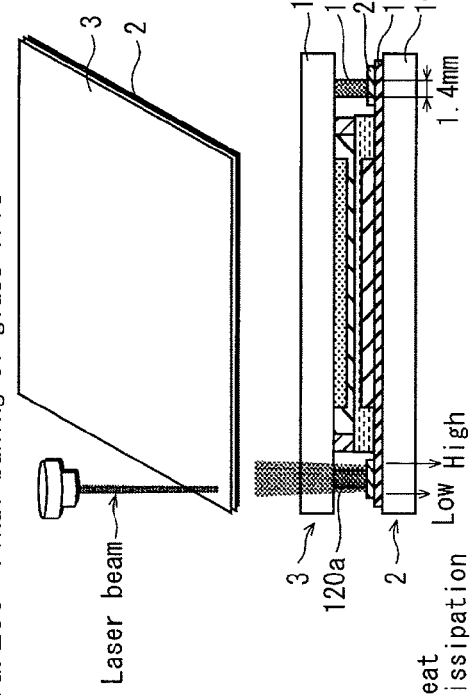
FIG. 20D Completion

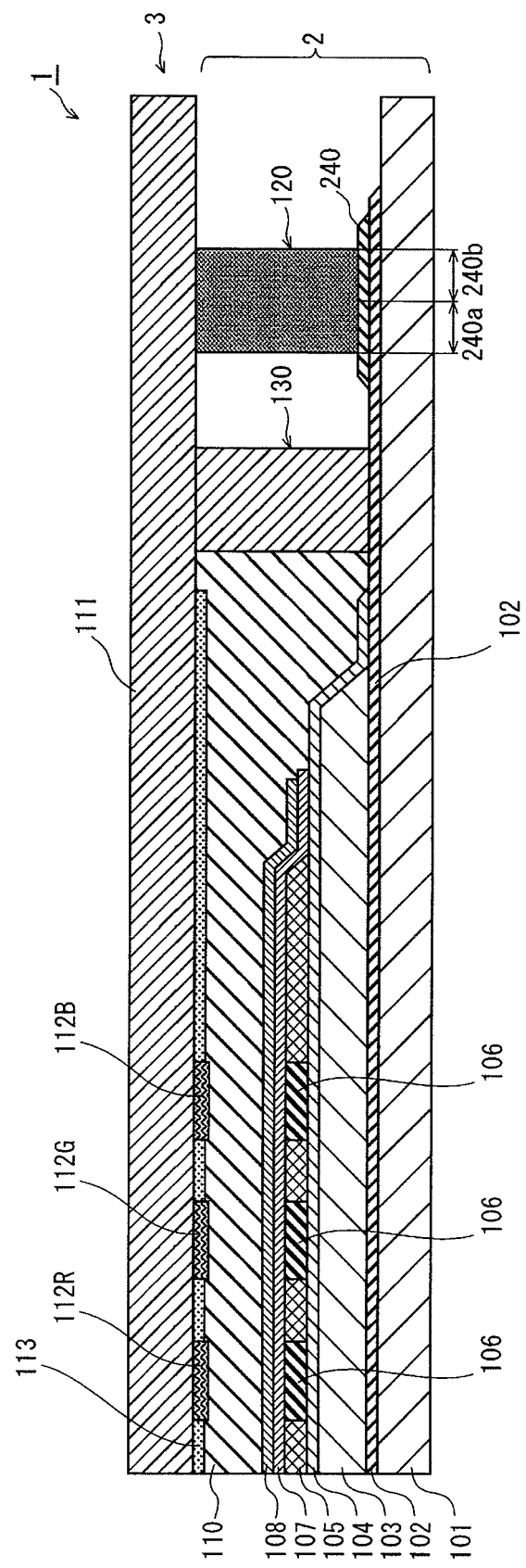

US 8,884,849 B2

DISPLAY PANEL AND PRODUCTION METHOD THEREOF

CROSS REFERENCE TO RELATED APPLICATION

This is a continuation application of PCT Application No. PCT/JP2011/004074 filed Jul. 19, 2011, designating the United States of America, the disclosure of which, including the specification, drawings and claims, is incorporated herein by reference in its entirety.

TECHNICAL FIELD

The present disclosure relates to a display panel in which a sealing substrate and a substrate having light-emitting elements thereon are sealed together using glass frit. The present disclosure also relates to a manufacturing method for such a display panel.

DESCRIPTION OF THE RELATED ART

Examples of display panels having light-emitting elements of a self-emission type include organic electroluminescence (EL) display panels, plasma display panels (PDP), and field emission displays (FED). Such display panels offer various advantages: not requiring a backlight; providing a wide viewing angle; being slim and suitable for power saving; having quick response time, and so on. Especially, organic EL display panels having an array of EL elements are receiving attention as next-generation displays replacing liquid crystal display devices.

A typical organic EL element has an organic EL laminate on a substrate, and the organic EL laminate includes a bottom electrode, organic material layers including a light-emitting layer, and a top electrode laminated in the stated order.

Generally, materials of such an organic EL laminate are highly active and unstable and therefore easily react with water and oxygen present in the air. Such a reaction with water and oxygen leads to significant deterioration of the characteristics of organic EL elements. It is therefore beneficial for an organic EL display panel that the organic EL elements are hermetically sealed against ambient air.

Various suggestions have been made for methods of sealing organic EL display panels and other display panels. As disclosed in Patent Literature 1, a typical sealing method involves placing a substrate on which organic EL elements are formed (hereinafter, referred to as an "EL-mounted substrate") and a glass substrate (hereinafter, referred to as a "sealing substrate") into face-to-face relation and sealing the two substrates together along their edges using glass frit.

More specifically, a glass frit paste is applied along the edges of the sealing substrate, and the sealing substrate is placed into a baking furnace to sufficiently remove solvent and binder from the paste. The resulting substrate is then placed face to face with the EL-mounted substrate.

In addition, to melt the glass frit for sealing, the glass frit is locally heated in order to avoid damaging the light-emitting elements. With the local heating, the substrates are hermetically sealed together by glass frit bonding, without causing deterioration of the light-emitting elements.

As described above, it is common to use a baking furnace for the process of removing solvent and binder from the glass frit paste applied on the substrate (drying process) and the process of pre-baking (shrink fitting) of the thus dried frit material, while it is common to use a laser for the process of welding the substrates together using the glass frit.

CITATION LIST

Patent Literature

[Patent Literature 1]
Japanese Patent Application Publication No. 2007-220647
[Patent Literature 2]
Japanese Patent Application Publication No. 2004-327197

SUMMARY

In the case where, as described above, a baking furnace is used for the process of removing solvent and binder from the glass frit paste applied on the substrate, the following should be noted. That is, the substrate subject to the process may have a color filter formed thereon. Since the temperate sufficient for removing solvent and binder is higher than the heat resistance temperature of the color filter, thermal deterioration of the color filter will be caused.

In one method suggested in view of the above, a laser is used for locally heating the glass frit paste applied on the sealing substrate to remove solvent and binder, so that the drying and pre-baking of the glass frit is carried out.

However, the process of drying and pre-baking by a laser causes abrupt evaporation of the solvent and binder present in the paste, which leads to occurrence of bubbles. Bubbles reduce the surface flatness of glass frit. Therefore, when a sealing substrate is placed face to face with the EL-mounted substrate, the EL-mounted substrate makes partial surface contact, rather than whole surface contact, with the dried and pre-baked glass frit. Welding glass frit that is in partial surface contact with an EL-mounted substrate results in poor bonding between the EL-mounted substrate and the sealing substrate. As a consequence, the mechanical strength of the bonding between the substrates is reduced, along with the reduction in the sealing strength, which accelerates deterioration of organic EL elements.

In another suggested method, glass frit paste is applied to a sealing substrate and the sealing substrate is placed face to face with the EL-mounted substrate, without removing solvent and binder contained in the paste. That is, the respective substrates are placed face to face while the glass frit remains pasty. In the latter method, after the substrates are placed face to face, the glass frit is locally heated by a laser (laser irradiation for the first time) to remove solvent and binder. Then, the glass frit is again locally heated (laser irradiation for the second time) by the laser adjusted to high power output, thereby joining the EL-mounted substrate and the sealing substrate together. According to the latter method, the substrates are joined together while the glass frit is in pasty liquid phase. Therefore, it is avoided that the glass frit makes partial surface contact with the substrate. Yet, bubbles are still evolved in the glass frit paste at the time of removing solvent and binder with a laser beam, which reduces the density of the glass frit. As a result, the mechanical strength of bonding between the substrates is reduced and the sealing strength is also reduced, which accelerates degradation of the organic EL elements.

Note that such problems are not specific to organic EL display panels and may commonly arise for various display panels in which an EL-mounted substrate and a sealing panel are sealed together by glass frit.

One non-limiting and exemplary embodiment is directed to a display panel having a pair of substrates and a plurality of light-emitting elements disposed between the pair of substrates sealed by glass frit and provides a display panel having excellent durability by improving the sealing strength of the glass frit as well as the mechanical strength.

In one general aspect, the techniques disclosed here feature: a display panel includes: a first substrate; a plurality of light-emitting elements disposed on a region of the first substrate; a second substrate facing the first substrate with the light-emitting elements therebetween; and a glass frit present between the first substrate and the second substrate so as to surround the region of the first substrate in which the light-emitting elements are disposed, the glass frit providing a hermetic seal between the first substrate and the second substrate. The glass frit has been baked by heating to elevate a temperature of the glass higher in an outer region than in an inner region.

Note that the inner region and the outer region of the glass frit described above are defined as follows. That is, the glass frit extending to surround the display region, which is a region of the panel in which the plurality of light-emitting elements are disposed, is divided in a widthwise direction into two regions: one of the regions closer to the display region is referred to as the "inner region", whereas the other region closer to the outer edge of the panel is referred to as the "outer region".

According to the configuration described above, the glass fit has been baked so that the outer region reaches a higher temperature than the inner region. As a result, a temperate gradient is caused by the glass frit in the process of baking the glass frit. Since the temperate of the glass frit is higher in the outer region and lower in the inner region, bubbles generated at the time of evaporation the solvent and binder move from the inner region toward the outer region. As a consequence, the glass frit is baked to be contracted from the outer region toward the inner region.

In addition, when the glass frit is heated to bond the first substrate to the second substrate, solvent components and binder components remaining, although slightly, in the glass frit evaporate to form bubbles again.

On the other hand, when the glass frit is cooled, the inner region solidifies before the outer region, because the temperature of the outer region is higher. Therefore, the glass frit solidifies to outwardly push the bubbles. Thus, bubbles move from the inner region toward the outer region, so that the glass frit solidifies to shrink in a direction from the outer region toward the inner region.

Owing to the above, the glass frit sealing the gap between the first substrate and the second substrate is compressed and bubbles remaining inside the glass frit are further reduced. Thus, the resulting glass frit is ensured to be of high density.

Consequently, the strength of bonding between the first substrate and the second substrate is improved, along with the increase in the strength of the hermetical seal of the first substrate and the second substrate, so that a display panel having excellent durability is realized. In addition, since the glass frit is compressed, the width of the glass frit seal is reduced to achieve the effect of narrowing the width of the glass frit.

These general and specific aspects may be implemented using a manufacturing method. Additional benefits and advantages of the disclosed embodiments will be apparent from the specification and Figures. The benefits and/or advantages may be individually provided by the various embodiments and features of the specification and drawings disclosure, and need not all be provided in order to obtain one or more of the same.

BRIEF DESCRIPTION OF DRAWINGS

FIGS. 3A-3D are views illustrating a manufacturing method of the organic EL display panel.

FIGS. 4A-4D are views illustrating the manufacturing method of the organic EL display panel.

FIGS. 5A-5D are views illustrating the manufacturing method of the organic EL display panel.

FIGS. 15A-15D are views illustrating a laser beam irradiation step performed in the pre-baking process according to the exemplary embodiment 2.

FIGS. 18A-18D are views illustrating a manufacturing method of the organic EL display panel.

FIGS. 19A-19D are views illustrating the manufacturing method of the organic EL display panel.

FIGS. 20A-20D are views illustrating the manufacturing method of the organic EL display panel.

FIG. 23 is a front view showing the structure of an organic EL display panel according to a modification of the exemplary embodiment 3.

DETAILED DESCRIPTION

Exemplary Aspects of the Present Disclosure

Figure 1:
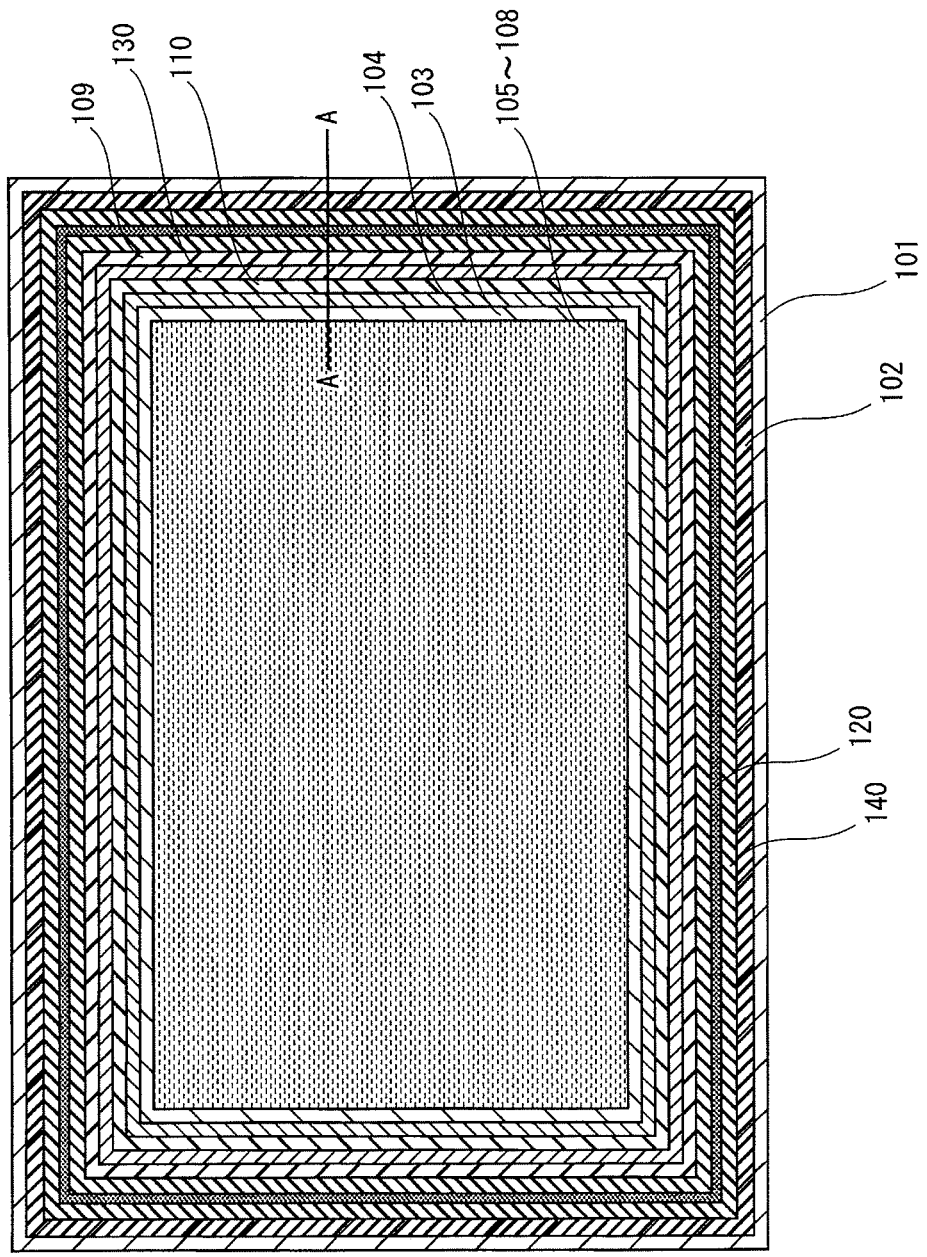
FIG. 1 is a front view showing the structure of an organic EL display panel according to an exemplary embodiment 1.

One aspect of the present disclosure provides a display panel that includes: a first substrate; a plurality of light-emitting elements disposed on a region of the first substrate; a second substrate facing the first substrate with the light-emitting elements therebetween; and a glass frit present between the first substrate and the second substrate so as to surround the region of the first substrate in which the light-emitting elements are disposed, the glass frit providing a hermetic seal between the first substrate and the second substrate. The glass frit has been baked by heating to elevate a temperature of the glass higher in an outer region than in an inner region.

According to the above configuration, the glass frit sealing a gap between the first substrate and the second substrate has been baked in a manner to elevate the temperate of the glass frit higher in the outer region than in the inner region. Thus, the inner region of the glass frit solidified before the outer region.

As a result, the volume of bubbles remaining in the glass frit has been reduced and thus the glass frit is ensured to be of high density.

Therefore, the strength of sealing of the first substrate and the second substrate improves, along with the increase in the strength of the bonding between the first substrate and the second substrate.

In a first method of the heating the glass frit to elevate the temperature in the outer region higher than that in the inner region, the glass frit may be heated by irradiation of light so that the outer region of the glass frit has received light of a higher energy density than that received by the inner region of the glass frit.

In one specific way for realizing the heating described above, the display panel may further include: a light-shielding part formed on one of the first substrate and the second substrate so as to extend along the glass frit. The light-shielding part reflects light and has a lower light-shielding property in a region corresponding to the outer region of the glass frit than in a region corresponding to the inner region of the glass frit.

To realize the light-shielding part having a higher light-shielding property in a region corresponding to the inner region of the glass frit than in a region corresponding to the outer region of the glass frit, the light-shielding part may be configured to have any of the following shapes.

The light-shielding part may have a plurality of isolated portions so distributed that an amount of shielded light is smaller in the region corresponding to the outer region of the glass frit than in the region corresponding to the inner region of the glass frit.

The light-shielding part may be a sheet having a plurality of through holes distributed so that an amount of light shielded is smaller in the region corresponding to the outer region of the glass frit than in the region corresponding to the inner region of the glass frit.

The light-shielding part may have a plurality of portions defining a grid pattern, and the portions of the light-shielding part are so arranged that the amount of light shielded is smaller in the region corresponding to the outer region of the glass frit than in the region corresponding to the inner region of the glass frit.

The light-shielding part may have a plurality of portions each extending in strip form in parallel to a lengthwise direction of the glass frit. The portions of the light-shielding part are spaced at intervals varied so that the amount of light shielded is smaller in the region corresponding to the outer region of the glass frit than in the region corresponding to the inner region of the glass frit.

The light-shielding part may have a plurality of tooth portions defining a comb-like pattern, each tooth portion extending outwardly from an inner edge of the light-shielding part to have one of lengths that are incrementally shorter. Consequently, the amount of light shielded by the light-shielding part is smaller in the region corresponding to the outer region of the glass frit than in the region corresponding to the inner region of the glass frit.

By configuring the light-shielding part in any of the above shapes, the amount of shielded light is appropriately adjusted even if the same material is used for the light-shielding part. Consequently, the amount of shielded light is adjusted with a simple configuration.

In the case where the light-shielding part is configured to have a comb-like shape, it may be preferable, for example, that the glass frit present between the first substrate and the second substrate extend to define a rectangle surrounding the region of the first substrate in which the light-emitting elements are disposed, and that each tooth portion of the light-shielding part extend perpendicular to a lengthwise direction of the glass frit. The light-shielding part having a comb-like shape as described above serves to guide outgas released from the glass frit material at the time of drying or baking the glass frit material with irradiation of light. By the light-shielding part, the outgas is guided to flow in a direction from the inner region to the outer region to be ultimately released to the outside of the glass frit. That is, the light-shielding part helps gas to flow from the inner region of the glass frit to the outer region of the glass frit, which is advantageous to reduce bubbles of outgas remaining in the glass frit.

Other ways to achieve the heating so that the outer region of the glass frit has received light of a higher energy than that received by the inner region of the glass frit include the following.

The glass frit may be subjected to the irradiation of light through a light-shielding mask. The amount of light shielded by the light-shielding mask is smaller in a region corresponding to the outer region of the glass frit than in a region corresponding to the inner region of the glass frit. Consequently, the outer region of the glass frit receives light of a higher energy density than that received by the inner region of the glass frit.

In another alternative, the glass frit may be subjected to the irradiation of light by scanning a spot of light along a location closer to an outer edge of the glass frit than to an inner edge of the glass frit. In yet another alternative, the glass frit may be subjected to the irradiation of light by applying a laser beam to the outer region of the glass frit at a higher frequency than to the inner region of the glass frit. In either alternative, it is still ensured that the outer region of the glass frit receives light of a higher energy density than that received by the inner region of the glass frit.

In a second method to achieve the heating the glass frit in a manner to elevate the temperature in the outer region higher than that in the inner region, the display panel may further include a heat-dissipating part disposed between the glass frit and one of the first substrate and the second substrate. The heat-dissipating part has a higher heat dissipating property in a region corresponding to the inner region of the glass frit than in a region corresponding to the outer region of the glass frit.

According to the above configuration, the glass frit sealing a gap between the first substrate and the second substrate has been heated by heat irradiation to elevate the temperate of the glass frit higher in the outer region than in the inner region.

To realize the heat-dissipating part having a higher heat-dissipating property in a region corresponding to the inner region of the glass frit than in a region corresponding to the outer region of the glass frit, the heat-dissipating part may be configured to have any of the following shapes.

In one example, the heat-dissipating part may be a sheet having a plurality of through holes so distributed that an area of the heat-dissipating part in contact with the glass frit (i.e., the percentage of an area occupied by portions actually in contact with the glass frit in the total area that is apparently in contact with the glass frit) is smaller in the outer region of the glass frit than in the inner region of the glass frit.

In another example, the heat-dissipating part may be a heat-dissipating sheet having a plurality of portions defining a grid pattern. The portions of the heat-dissipating part are so arranged that an area of the heat-dissipating part in contact with the glass frit is smaller in the outer region of the glass frit than in the inner region of the glass frit.

In yet another example, the heat-dissipating part may have a plurality of tooth portions defining a comb-like pattern. Each tooth portion extends outwardly from an inner edge of the heat-dissipating part to have one of lengths that are incrementally shorter so that an amount of heat dissipated by the heat-dissipating part is larger in a region corresponding to the inner region of the glass frit than in a region corresponding to the outer region of the glass frit.

In yet another example, the heat-dissipating part may have a serrated-outer edge defined by a plurality of tooth portion extends outwardly from an inner edge portion. Each tooth portion has a diminishing width toward the outer edge so that an amount of heat dissipated by the heat-dissipating part is larger in a region corresponding to the inner region of the glass frit than in a region corresponding to the outer region of the glass frit.

By configuring the heat-dissipating part to have any of the above shapes, the amount of heat dissipated is appropriately adjusted even if the same material is used for the heat-dissipating part. Consequently, the amount of heat dissipated is adjusted with a simple configuration.

In the case where the heat-dissipating part has a plurality of tooth portions defining a comb-like pattern, the following may be preferable, for example. That is, the glass frit present between the first substrate and the second substrate may extend to define a rectangle surrounding the region of the first substrate in which the light-emitting elements are disposed. Each tooth portion of the heat-dissipating part may extend perpendicular to a lengthwise direction of the glass frit.

The heat-dissipating part having a comb-like shape as described above serves to guide outgas released from the glass frit material at the time of drying or baking the glass frit material with irradiation of light. By the heat-dissipating part, the outgas is guided to flow in a direction from the inner region to the outer region to be ultimately released to the outside of the glass frit.

In the manner described above, in the process of thermal irradiation, gas flow in a direction from the inner region to the outer region of the glass frit is accelerated, which helps to prevent gas from remaining as bubbles within the glass frit.

In the display panel having the above configuration, for improving the sealing strength, it may be preferable, for example, that the glass frit has been shrieked to pull the outer region toward the inner region.

In addition, the glass frit may have undergone shrinkage to pull the outer region toward the inner region. With this configuration, the width of the glass frit part is reduced, which is advantageous to reduce the size of the peripheral region of the display panel. Furthermore, due to the temperature gradient of the glass frit caused in the manufacturing, the volume of bubbles remaining in the inner region of the glass frit is made smaller than the volume of bubbles remaining in the outer region of the glass frit.

In the display panel having the above configuration, the display panel according to the above aspect may further include: a color filter disposed on the second substrate so as to be located between the first substrate and the second substrate. The color filter is configured to selectively transmit a specific color of light emitted from the light-emitting elements and having a glass transition temperature lower than a melting point of the glass frit. With this display panel, it may be preferable, for example, that the glass frit have been baked by selectively heating the glass frit with irradiation of light, such as a laser beam.

In the display panel having the above configuration, the glass frit may be manufactured by applying a glass frit material containing glass frit and a predetermined solvent on one of the first substrate and the second substrate. In this case, the glass frit material has been dried by the irradiation of light to evaporate (or sublimate) the solvent and binder contained in the glass frit material. Due to the temperature gradient caused in the glass frit material, the solvent and binder evaporate from the outer region of the glass frit material before the evaporation from the inner region. Therefore, bubbles evolved in the glass frit material during the process of drying the glass frit material are made to escape to the outer region of the glass frit material. This reduces bubbles evolved in the glass frit material are trapped inside the panel to cause deterioration of the light-emitting elements.

In addition, after the glass frit material was dried under a force pulling the outer region toward the inner region, the glass frit material present was baked by the irradiation of light (to cause the glass frit material to melt and solidify to bond the first substrate and the second substrate). At this time, due to the temperature gradient, the inner region having a lower temperature solidifies before the outer region having a higher temperature. That it, in the process of baking the glass frit material, bubbles evolved in the glass frit are made to escape to the outer region of the glass frit, so that the glass frit material is baked to cause shrinkage in a direction from the outer region toward the inner region. Therefore, the glass frit sealing the gap between the first substrate and the second substrate has been baked to be compressed to high density. As a result, the sealing strength of the first substrate and the second substrate further improves.

Further, the display panel according to the above configuration may further include a seal part present between the first substrate and the second substrate so as to surround a region of the first substrate in which the light-emitting elements are disposed and the seal part is located inwardly of the glass frit.

Note that outgas derived from the solvent and binder contained in the glass frit material may be emitted at the time of baking the glass frit material into the glass frit by heat irradiation. The seal part provided between the light-emitting elements and the glass frit prevents gas emitted from the glass frit material at the time of baking the glass frit material from entering into the region in which the light-emitting elements are disposed. Consequently, deterioration of the light-emitting elements is prevented. By virtue of the above, reduction of the life and luminous efficiencies of the light-emitting elements is prevented.

Further, the display panel according to the configuration above may further include an encapsulating resin layer encapsulating the light-emitting elements. This is advantageous to further improve the strength of encapsulating (i.e., sealing) the light-emitting elements.

One aspect of the present disclosure provides a manufacturing method for a display panel. The method includes: a first process of preparing a first substrate; a second process of forming a plurality of light-emitting elements on the first substrate; a third process of preparing a second substrate; a fourth process of applying a glass frit paste containing a predetermined solvent on one of the first substrate and the second substrate, the glass frit paste being applied to surround, when the first substrate and the second substrate are joined together, a region in which the light-emitting elements are formed; a fifth process of placing the first substrate and the second substrate face to face across the light-emitting elements; and a sixth process of heating the glass frit applied in the fourth process. In the sixth process, the glass frit paste is heated by irradiation of heat to cause a temperature gradient such that a temperature of the glass frit paste is higher in an outer region of the glass frit paste than in an inner region of the glass frit paste.

In the process of drying the glass frit paste to cause evaporation of the solvent and binder, bubbles are generated within the glass frit paste. Yet, according to the above manufacturing method, the volume of bubbles remaining in the inner region of the glass frit is ensured to be smaller than the volume of bubbles remaining in the outer region of the glass frit. As a result, the sealing strength of the first substrate and the second substrate improves.

In addition, in the process of drying the glass frit paste to cause evaporation of the solvent and binder, outgas is generated in the glass frit paste. Yet, the glass frit paste serves to prevent outgas from entering into the region bounded by the glass frit paste. Consequently, the light-emitting elements are protected from deterioration which would be caused by exposure to the outgas.

In the sixth process, the glass frit paste is heated so that the temperature of the glass frit paste is higher in the outer region than in the inner region. In a first method for achieving such heating, the glass fit paste may be heated by irradiation of light so that the glass frit paste receives light of a higher energy density in the outer region of the glass frit paste than in the inner region of the glass frit paste.

More specifically, it may be preferable, for example, that the manufacturing method further include: disposing, before the fourth process, a light-shielding part on one of the first substrate and the second substrate to surround, when the first substrate and the second substrate are joined together, a region in which the light-emitting elements are formed; applying, in the fourth process, the glass frit paste along the light-shielding part; and irradiating with light, in the sixth process, the glass frit paste present between the first substrate and the second substrate to evaporate the solvent from the glass frit paste. The light-shielding part has a lower light-shielding property in a region corresponding to the outer region of the glass frit paste than in a region corresponding to the inner region of the glass frit.

For example, it may be preferable, for example, that the light irradiation in the sixth process be carried out by a laser beam directed to reach the glass frit paste after passing through the light-shielding part.

For example, it may be preferable, for example, that the width of the glass frit paste applied in the fourth process be narrower than the width of light irradiated onto the glass frit in the sixth process.

A second method for achieving heating of the glass frit paste in the sixth process to cause the temperature of the glass frit paste to be higher in the outer region is as follows. That is, the manufacturing method may further include: disposing, before the fourth process, a heat-dissipating part on one of the first substrate and the second substrate so as to surround, when the first substrate and the second substrate are joined together, a region in which the light-emitting elements are formed, the heat-dissipating part having a higher heat-dissipating property in an inner region of the heat-dissipating part than in an outer region of the heat-dissipating part; and applying, in the fourth process, the glass frit paste containing the predetermined solvent along the heat-dissipating part.

In the method of manufacturing a display panel according to the above aspect, it may be preferable, for example, that the heat irradiation in the sixth process be carried out by irradiating with a laser beam.

Further, it may be preferable, for example, that the laser irradiation be carried out by directing the laser beam to the glass frit paste from a direction opposite to the heat-dissipating part.

For example, it may be preferable, for example, that the width of the glass frit paste applied in the fourth process be narrower than the width of light irradiated onto the glass frit paste in the sixth process.

In the method of manufacturing a display panel according to the above aspect, the following may be preferable, for example: in the light irradiation in the sixth process, the solvent contained in the glass frit paste evaporate so that the outer region of the glass frit paste dries before the inner region of the glass frit; at the time when the solvent contained in the glass frit paste evaporates from the outer region before the evaporation from the inner region, bubbles evolved in the glass frit paste escape to the outer region of the glass frit paste; and the glass frit paste dries in a state where the outer region is pulled toward the inner region. As a consequence, the strength of bonding between the first substrate and the second substrate improves, along with the increase in the strength of sealing between the first substrate and the second substrate.

Further, in the method of manufacturing a display panel according to the above aspect, it may be preferable to additionally include the following seventh process (final baking process) after the sixth process (provisional baking process). In the seventh process, the glass frit paste having been dried as a result of the evaporation of the solvent by heat irradiation in the provisional baking process is heated so that the outer region of the glass frit paste reaches a higher temperature than the inner region of the glass frit paste.

In the seventh process, the glass frit paste having been dried as a result of the evaporation of the solvent melts and then solidifies to bond the first substrate to the second substrate. At this time, the inner region of the glass frit paste solidifies before the outer region because the temperature of the inner region is lower.

In addition, at the time when the inner region of the glass frit paste bakes before the outer region of the glass frit, bubbles evolved in the glass frit paste escape to the outer region of the glass frit paste, and the glass frit paste dries in a state where the outer region is pulled toward the inner region. Thus, the glass frit sealing the gap between the first substrate and the second substrate is baked to be compressed to high density. As a result, the sealing strength of the first substrate and the second substrate further improves.

The frit glass baked in the above manner is advantageous for improving the sealing strength and the effect of preventing the light-emitting elements.

In the seventh process, it may be preferable; for example, that the heating of the glass frit paste be carried out by irradiating with a laser beam and that the laser irradiation be carried out by directing the laser beam to the glass frit paste from a direction opposite to the heat-dissipating part. That is, by laser irradiation, the glass frit paste is locally heated without heating other component elements, such as the light-emitting elements.

It may be preferable, for example, that the width of the glass frit paste applied in the fourth process be narrower than the width of heat irradiated onto the glass frit in the seventh process. In this way, the glass frit material is heated by simply scanning the glass frit with heat irradiation.

In the seventh process, due to the temperature gradient caused in the glass frit paste having been heated and dried as a result of the evaporation of the solvent, the inner region of the glass frit material bakes before the outer region of the glass frit. At this time, it may be preferable, for example, that bubbles evolved in the glass frit material escape to the outer region of the glass frit material, and that the glass frit material dries in a state where the outer region is pulled toward the inner region.

EXEMPLARY EMBODIMENTS

Exemplary Embodiment 1

General Structure of Panel

Figure 2:
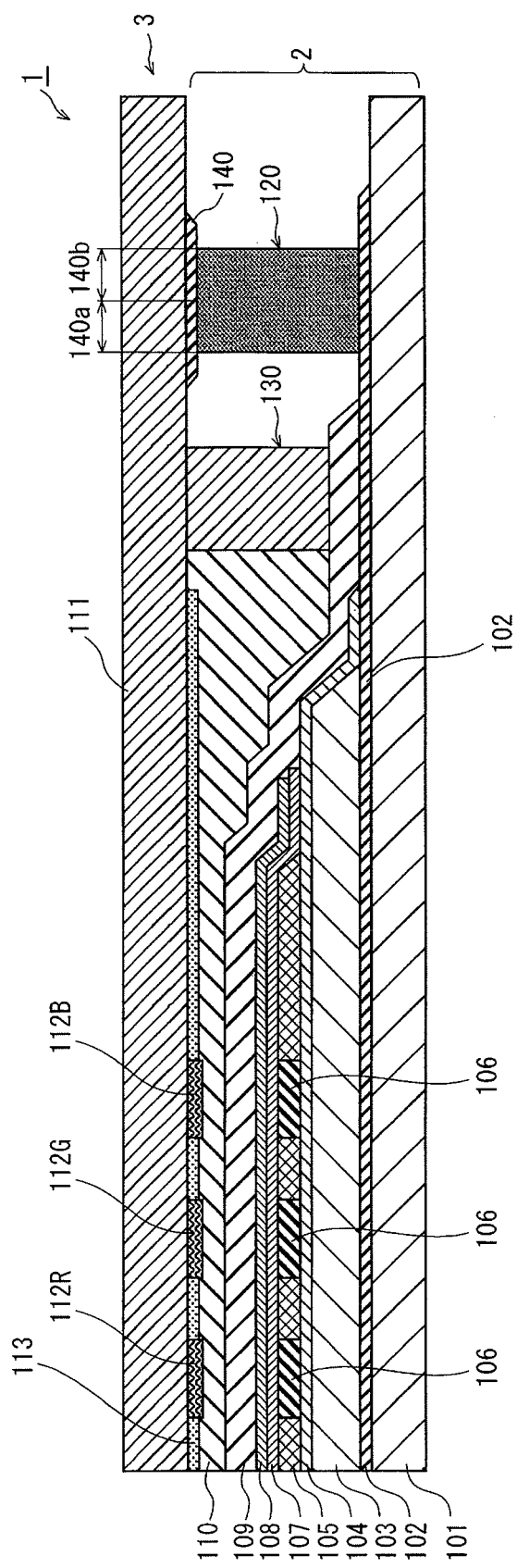
FIG. 2 is a cross-sectional view showing the structure of the organic EL display panel.

FIG. 1 is a front view of an organic EL display panel 1 according to an exemplary embodiment 1 of the present disclosure. FIG. 2 is a cross-sectional view of the organic EL display panel 1, showing part of the panel taken laterally along line A-A of FIG. 1.

The organic EL display panel 1 includes an EL substrate 2 having organic EL elements formed on one main surface and a CF substrate 3 having a color filter. The EL substrate 2 and the CF substrate 3 are opposed to each other with an encapsulating resin layer 110 therebetween and sealed together along their edge portions by a glass frit part 120 and a seal part 130.

The organic EL display panel 1 has a display region in which top-emission organic EL elements of respective colors of RGB are arranged next to one another in a matrix, whereby a color image is displayed on the top surface of the CF substrate 3. One organic EL element corresponds to a sub-pixel and a combination of three sub-pixels, one for each of the three colors, form one picture element (pixel).

Structure of EL Substrate 2

On a surface of a TFT substrate 101, thin-film transistors (TFTs), a passivation layer 102, a planarizing film 103, an anode 104, banks 105, an electron transport layer (ETL) 107, a cathode 108, and a thin encapsulating layer 109 laminated in the stated order.

The TFT substrate 101 is formed with an insulating material such as alkalifree glass, soda glass, nonfluorescent glass, phosphate glass, borate glass, quartz, acrylic resin, styrene resin, polycarbonate resin, epoxy resin, polyethylene resin, polyester resin, and silicone resin, alumina, etc. On a surface of the TFT substrate 101, the TFTs and their line electrodes are formed in a predetermined pattern.

The passivation layer 102 is a thin film made of silicon oxide (SiO) or silicon nitride (SiN) and coats the TFTs and line electrodes to provide protection.

The planarizing film 103 is made of an insulating material, such as polyimide resin or acrylic resin, and coats the surface of the passivation layer 102 to fill out the unevenness to provide a flat surface.

The anode 104 is made of a light-reflective material to cover the entire display region. Examples of the light-reflective material include silver (Ag) as well as alloy of silver, palladium, and copper (APC), alloy of silver, rubidium, and gold (ARA), alloy of molybdenum and chromium (MoCr), and alloy of nickel and chromium (NiCr). Note that layers such as an ITO layer, a hole-transport layer, and a hole-injection layer may be additionally provided on the surface of the anode 104.

On the anode 104, the banks 105 made of an insulating organic material (such as acrylic resin, polyimide resin, novolac-type phenolic resin, etc.) are formed. The banks 105 are formed in stripes extending in the vertical direction as seen in FIG. 2 or in a grid pattern.

The surface of a hole-injection layer 4 is divided by the banks 105 into a plurality of regions in each of which a light-emitting layer 106 of one of the RGB colors is formed. When driven, the light-emitting layers 106 emit light in a corresponding color upon recombination of carriers (holes and electrons). Note that an electron transport layer may be additionally provided on the light-emitting layer 106.

In a manner to coat the light-emitting layers 106, an electron transport layer (ETL) 107 and the cathode 108 are formed to cover the entire display region. The ETL 107 transports electrons injected from the cathode 108 to the light-emitting layers 106. The cathode 108 is a film made of a transparent material, such as ITO, or indium zinc oxide (IZO).

The thin encapsulating layer 109 is a layer for preventing the light-emitting layers 106 from being exposed to water, air, etc. The thin encapsulating layer 109 is made of a transparent material, such as silicon nitride (SiN) or silicon oxynitride (SiON) and covers the entire display region.

Structure of CF Substrate 3

The CF substrate 3 has a glass substrate 111 and color filters 112(R), 112(G), and 112(B) and a black matrix (hereinafter, "BM") 113 disposed on the lower surface of the glass substrate 111.

Each of the color filters 112(R), 112(G), and 112(B) are disposed to correspond in position to the light-emitting layers 106 formed on the EL substrate 2.

The BM 113 is made of an ultraviolet-curing resin material containing black pigment with excellent light-absorption and light-shielding properties and thereby serves to improve display contrast.

<Encapsulating Resin Layer 110, Glass Frit Part 120, and Seal Part 130>

A transparent resin material is densely filled between the thin encapsulating layer 109 of the EL substrate 2 and the CF substrate 3 to form an encapsulating resin layer 110 across the display region of the organic EL display panel 1. The encapsulating resin layer 110 formed by filing a transparent resin material (such as epoxy resin, acrylic resin, or silicone resin) inside the seal part 130 prevents ingress of moisture and gas from the outside.

Note that the encapsulating resin layer 110 is not an essential component and may be omitted. Yet, provision of the encapsulating resin layer 110 serves to improve the sealing strength, mechanical strength, and light-extracting efficiency of the organic EL elements.

In addition, the glass frit part 120 and the seal part 130 each extend between the EL substrate 2 and the CF substrate 3 as shown in FIG. 2 to define a loop shape along the outer edge portions of the organic EL display panel 1 so as to surround the display region. Note that the term "loop" used herein does not necessarily mean a curved or circular shape.

The glass frit part 120 is made of glass frit having a low melting point. The seal part 130 is made of a dense resin material examples of which include a silicone resin and an acrylic resin.

The glass frit part 120 as well as the seal part 130 includes spacers for defining the distance between the EL substrate 2 and the CF substrate 3. The spacers are made of a material such as silica and may have various shapes, including a circular cylindrical shape, a rectangular parallelepipedal shape, and a spherical shape. The spacers are disposed so that the opposing edges of each spacer abut against the EL substrate 2 and the CF substrate 3. Yet, the inclusion of spacers in the glass frit part 120 and the seal part 130 is not essential.

The seal part 130 serves to seal the transparent resin material forming the encapsulating resin layer 110 inside the space bounded by the seal part 130. Note in addition that the seal part 130 is not essential either. With the use of a masking tape, as disclosed by Patent Literature 2, the seal part 130 may be omitted.

Light-Shielding Part 140:

In addition, the organic EL display panel 1 has a light-shielding part 140 that extends along the outer edge of the organic EL display panel 1 in a manner to be sandwiched between the glass substrate 111 and the glass frit part 120 that is formed on the passivation layer 102.

The light-shielding part 140 is a component that reflects light (laser beam) directed to the glass frit part 120 from the outside. The light-shielding part 140 is made of a material not meltable at the softening point of the glass frit part 120. Examples of such materials include metal materials, such as aluminum (Al), gold (Au), silver (Ag), copper (Cu), nickel (Ni), chromium (Cr), titanium (Ti), molybdenum (Mo), tungsten (W), platinum (Pt), rhodium (Rh), zinc (Zn), and stannum (Sn), as well as an alloy of any one or more of these metals.

As shown in FIGS. 1 and 2, the light-shielding part 140 is formed define a loop shape extending along the outer edge portions of the organic EL display panel 1 in a manner to overlap with the glass frit part 120.

The light-shielding part 140 has a region that overlaps with the glass frit part 120 and the overlapping region is divided into an inner region 140a and an outer region 140b. The inner region 140a is designed to shield a greater amount of light (i.e. have a larger light-shielding area) than the outer region 140b does. The details thereof will be described later.

(Example of Structure of Display Device)

Figure 10:
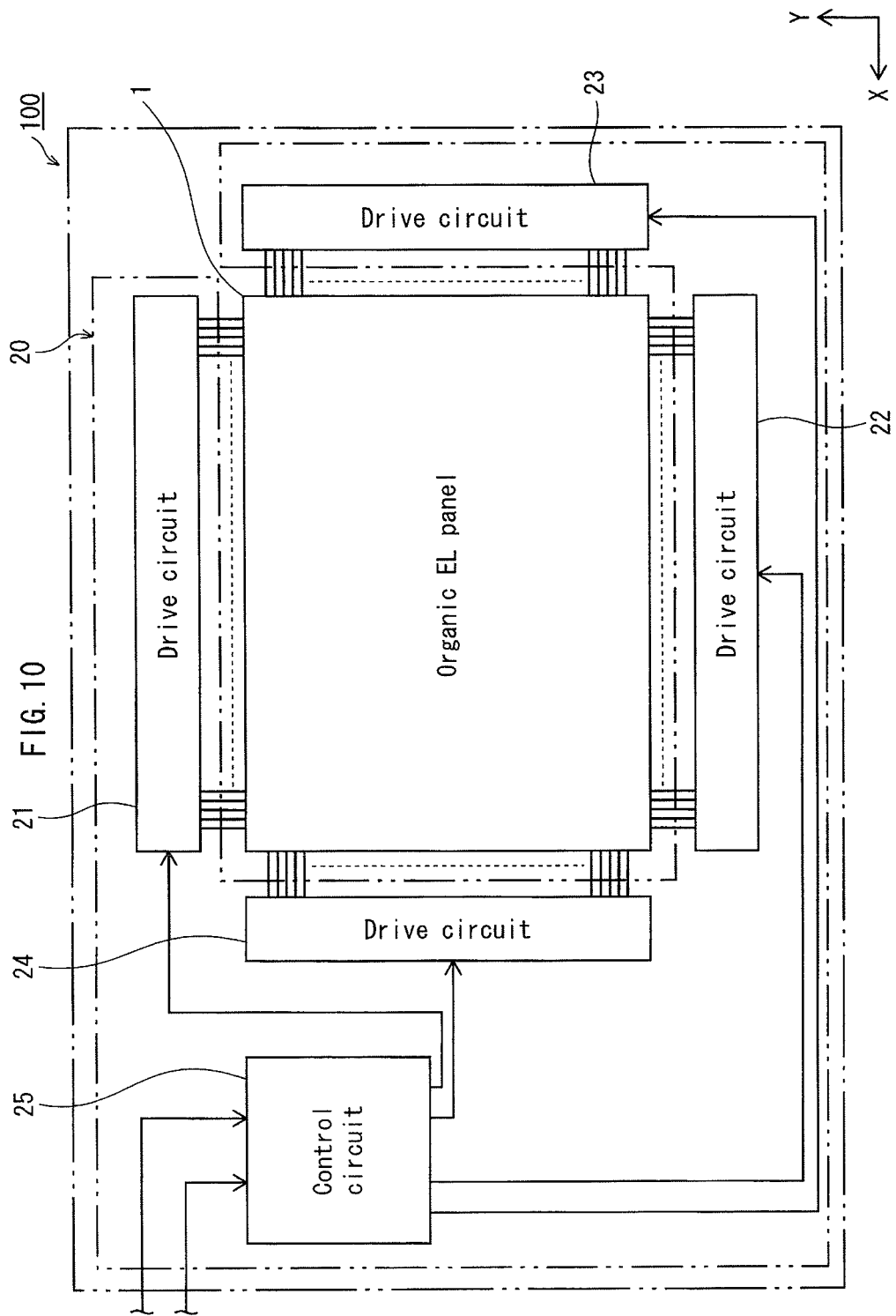
FIG. 10 is a view showing the overall structure of a display device 100 according to an exemplary embodiment.

FIG. 10 is a view showing the structure of a display device 100 that includes the display panel 1 described above.

The display device 100 includes the display panel 1 and a drive control unit 20 connected to the display panel 1. The drive control unit 20 includes four drive circuits 21-24 and a control circuit 25.

Figure 11:
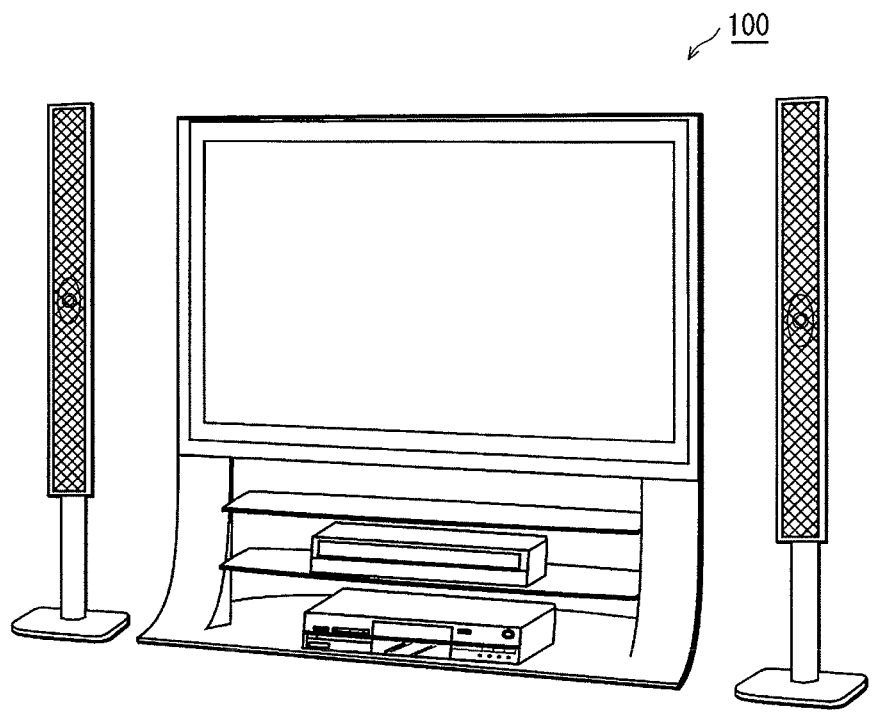
FIG. 11 shows an external representation of an example of a television system that includes the display device 100.

FIG. 11 shows an external representation of an example of a television system that includes the display device 100.

<Manufacturing Method of Organic EL Display Panel>

FIGS. 3-5 are views illustrating a manufacturing method of the organic EL display panel 1.

(1) Process of Preparing EL Substrate 2:

To prepare the EL substrate 2 shown in FIG. 3A, TFTs, a passivation layer 102, a planarizing film 103, an anode 104, banks 105, light-emitting layers 106, an ETL 107, a cathode 108, and a thin encapsulating layer 109 are formed on a main surface of a TFT substrate 101.

The material of the passivation layer 102 may be any of silicon nitride (SiN), silicon oxide (SiO), and silicon oxynitride (SiON).

In this embodiment, the passivation layer 102 is a 500-nm-thick silicon nitride (SiN) layer.

The material of the thin encapsulating layer 109 may be any of silicon nitride (SiN), silicon oxide (SiO), and silicon oxynitride (SiON).

The thin encapsulating layer 109 may be a monolayer or a laminate of a plurality of layers.

In this embodiment, the thin encapsulating layer 109 is a 2000-nm-thick SiN layer.

(2) Process of Preparing CF Substrate 3:

To prepare the CF substrate 3 shown in FIG. 3B, a color filter 112, a BM 113, and a light-shielding part 140 are formed on the lower surface of a glass substrate 111.

The light-shielding part 140 is a thin film of a light-shielding material formed by deposition or sputtering, followed by patterning by photolithography. The light-shielding part 140 may be of a monolayer or multilayer structure. In the case of a multilayer structure, each layer is formed to have basically the same pattern.

In one example, the light-shielding part 140 is a single chromium (Cr) layer with a thickness of 200 nm.

(3) Process of Forming Seal Material (DAM) 130a

As shown in FIG. 3C, an encapsulating resin is applied on the surface of the CF substrate 3 along its peripheral regions in a manner that the display region is surrounded by the encapsulating resin applied.

Examples of the encapsulating resin include an acrylic resin (UV curing), an epoxy resin (UV curing), and an epoxy resin (thermosetting). The viscosity of resin to be applied is set to fall within the range of 100,000 mPa·sec to 1,000,000 Pa·sec.

In this embodiment, a UV curing epoxy resin is used as the encapsulating resin, and spherical silica particles (20 μm in diameter) are contained in the encapsulating resin. The viscosity is set to 500,000·Pa·sec.

The encapsulating resin is applied using a dispenser to draw a closed loop with a line that is 500 μm wide and 80 μm high.

(4) Process of Applying Encapsulating Resin 110a

As shown in FIG. 3D, an encapsulating resin 110a is applied in dots within the display region on the surface of the CF substrate 3.

Example materials of the encapsulating resin 110a include an acrylic resin (UV curing), an epoxy resin (UV curing), and an epoxy resin (thermosetting).

In this embodiment, manufacturing of a top-emission type organic EL display panel is assumed. Therefore, a UV curing epoxy resin that is colorless transparent and has a reflective index of about 1.6 is used. The viscosity of the resin to be applied is set to fall within the range of 100 mPa·sec to 500 mPa·sec (200 mPa·sec, for example) and applied using a jet dispenser. The amount of resin per drop is set to fall within the range of 0.2 μL to 2.0 μL, and 1.0 μL, for example. The size of each dot of the encapsulating resin 110a is about 8 mm in diameter and 150 μm in height.

Despite its flowability, the resin applied is retained within the region bounded within a loop drawn by a seal material 130a.

Note that a thermoplastic sheet may be usable as the encapsulating resin 110a. In that case, the process of forming the seal material 130a may be omitted.

(5) Process of Applying Glass Frit:

As shown in FIG. 4A, glass frit paste 120a is applied on the light-shielding part 140 that is formed on the surface of the CF substrate 3.

The glass frit paste 120a is a mixture of glass frit (powder), spacers, binder, and solvent.

As the glass frit, alkalifree glass that is less damaging to the organic EL elements is used.

In addition to components such as silicon dioxide ($SiO_2$) that from the skeleton of glass, the glass includes various components, such as zinc oxide (ZnO), boron oxide ($B_2O_3$), stannous oxide (SnO), bismuth oxide ($Bi_2O_3$), vanadium oxide ($V_2O_5$), aluminum oxide ($Al_2O_3$), tungsten oxide ($WO_3$), molybdenum oxide ($MoO_3$), niobium oxide ($Nb_2O_3$), titanium oxide ($TiO_2$), zirconium oxide ($ZrO_2$), lithium oxide ($Li_2O$), sodium oxide ($Na_2O$), potassium oxide ($K_2O$), cesium oxide ($Cs_2O$), copper oxide (CuO), manganese dioxide ($MnO_2$), magnesium oxide (MgO), calcium oxide (CaO), strontium oxide (SrO), and barium oxide (BaO).

In one example, the glass frit contains one or more transition metals for improving absorption of infrared radiation, which is in a wavelength region of lasers used for baking frit.

Examples of spacers include spherical silica particles ($SiO_2$). Spacers used herein have a diameter corresponding to the distance of the gap to be secured between the substrates 2 and 3. In this embodiment, spaces each measuring 20 μm in diameter are used.

Examples of binder include cellulose, such as nitrocellulose or ethylcellulose, and acrylic resin whose raw material monomer is methyl methacrylate, propyl methacrylate, or butylmethacrylate. In this embodiment, nitrocellulose having a low decomposition temperature is used.

Examples of the solvent include terpineol, butyl carbitol, isobornyl acetate, butyl carbitol acetate, cyclohexane, methyl ethyl ketone, toluene, xylene, thyl acetate, and butyl stearate.

The glass frit paste 120a is adjusted to have the viscosity falling within the range of 100,000 mPa·sec to 1,000,000 mPa·sec (200,000 mPa·sec, for example) and applied with the use of a dispenser to draw a line forming a closed loop on the CF substrate 3 in a manner that the display region is surrounded by the line of the glass frit paste.

As shown in FIG. 4A, the glass frit paste 120a applied is 700 μm wide and 90 μm high, for example.

(6) and (7) Process of Joining Substrates

As shown in FIGS. 4B and 4C, the EL substrate 2 is placed on the CF substrate 3 on which the glass frit paste 120a is applied and adjusted for proper alignment. This process is carried out in a vacuum chamber (10 Pa or lower, for example). The EL substrate 2 and the CF substrate 3 may be provided with an alignment mark in advance, so that the respective substrates are accurately aligned. The chamber may be evacuated to vacuum after the alignment.

Next, the EL substrate 2 and the CF substrate 3 are pressed by, for example, a mechanical press to the extent that the encapsulating resin 110a, the seal material 130a, and the glass frit paste 120a spread to be flatten.

Due to the pressure applied, the encapsulating resin 110a and the glass frit paste 120a spread out. As a result, the gap between the EL substrate 2 and the CF substrate 3 becomes a closed space (closed loop) doubly surrounded by the seal material 130a and the glass frit paste 120a, and the encapsulating resin 110a is retained in the closed space.

Next, nitrogen is introduced into the vacuum chamber to change the pressure from vacuum back to the atmospheric pressure, which causes the EL substrate 2 and the CF substrate 3 to be pressed evenly by a force (generated by the same differential pressure between the atmospheric pressure and vacuum). As a result, the substrates 2 and 3 are brought into even more intimate contact. Yet, by the presence of the spacers, the gap between the substrates 2 and 3 is secured to be 20 μM.

Within the space surrounded by the seal material 130a, the encapsulating resin 110a continues to spread until there is no vacancy left. On the other hand, the space enclosed between the glass frit paste 120a and the seal material 130a remain vacuumed.

By the presence of vacuumed space, the EL substrate 2 and the CF substrate 3 remain under the differential pressure even after the substrates are joined together, so that the effect of clipping is achieved.

Through the process of joining the substrates together, the EL substrate 2 and the CF substrate 3 are hermetically joined together by the seal material 130a and the glass frit paste 120a.

(8) Process of Flipping

The EL substrate 2 and the CF substrate 3 thus joined together are flipped as shown in FIG. 4D.

As shown in FIG. 4C, the seal material 130a after the substrate joining measures 1.5 mm in width and 20 μm in height. This height is equal to the diameter of a spacer and the distance between the EL substrate 2 and the CF substrate 3 is also fixed to be equal to the spacer's diameter. As shown in FIG. 4D, the glass frit paste 120a measures 2 mm in width and 20 μm in height.

(9) Process of UV Irradiation and Thermosetting:

As shown in FIG. 5A, the entirety of the EL substrate 2 and the CF substrate 3 that are joined together is irradiated with UV light from the direction of the CF substrate 3.

The UV light is with wavelength of 365 nm and the cumulative irradiation of 2J. Upon exposure to UV light, the seal material 130a and the encapsulating resin 110a start to cure. After the UV irradiation, the joined substrates 2 and 3 are heated at 100° C. for 20 minutes to further promote the curing.

(10) Process of Pre-Baking Glass Frit

As shown in FIG. 5B, the glass frit paste 120a present between the EL substrate 2 and the CF substrate 3 joined together is irradiated with a laser beam through the CF substrate 3 for heating to high temperatures not to cause melting of glass (for example, up to 350° C.). As a result, the glass frit paste 120a dries through evaporation (or sublimation) of the solvent and binder. Note that the laser beam is emitted from the direction of the CF substrate 3 to irradiate the glass frit paste 120a. That is, the laser beam reaches the glass frit paste 120a after passing through the light-shielding part 140.

It is beneficial to use a laser of a suitable wavelength selected to match the adsorption band of the transition metal oxide contained in the glass frit. Reversely, it is beneficial to select glass frit containing a transition metal oxide having the adsorption band matching the wavelength of a laser to be used.

In this example, a semiconductor laser is used as an irradiation source and the laser emits a continuous wave (CW) at the wavelength of 905 nm, laser power of 30 W, and scanning speed of 2.0 mm/sec. In addition the spot diameter $\Phi$ is 3.2 mm, which is larger than the width (2 mm) of the glass frit paste 120a applied. Note that the laser used herein is not limited to a CW laser and may be a pulsed laser. Furthermore, examples of the laser include a YAG laser (wavelength 1064 nm) in addition to a semiconductor laser.

In accordance with the amount of light shielded by the light-shielding part 140, a temperature gradient is formed within the glass frit part 120. More specifically, the outer region (highest tempter region) of the glass frit part 120 reaches the temperature of the order of 350° C. and the inner region (lowest temperature region) reaches the temperature of the order of 200° C.

Through the process of pre-baking, the solvent is evaporated and the binder is sublimated or evaporated from the glass frit paste 120a.

(11) Process of Final Baking Glass Frit

As shown in FIG. 5C, the glass frit part 120 present between the EL substrate 2 and the CF substrate 3 joined together is irradiated with a laser beam through the CF substrate 3 to be heated to temperatures causing the glass to melt (700° C. for example) to carry out the final baking. Similarly to the pre-baking, the laser beam in this process also reaches the glass frit part 120 after passing through the light-shielding part 140.

Similarly to the process of drying (i.e., pre-baking) described above, a semiconductor laser is used as an irradiation source and the laser emits a continuous wave (CW) at the wavelength of 905 nm and the spot diameter $\Phi$ is 3.2 mm. However, the laser power is 90 W and the scanning speed is 10.0 mm/sec in this process.

Note that the laser may be a YAG laser (wavelength 1064 nm).

In accordance with the amount of light shielded by the light-shielding part 140, a temperature gradient is formed within the glass frit part 120. More specifically, the outer region (highest tempter region) of the glass frit part 120 reaches the temperature of the order of 800° C. and the inner region (lowest temperature region) reaches the temperature of the order of 500° C.

In this process of the final baking, the glass frit contained in the glass frit part 120 melts and then is solidified to complete the sealing.

(12) Through the Above Processes, the Organic EL Display Panel 1 as Shown in FIG. 5D is completed.

According to the manufacturing method described above, glass fit is dried and baked with laser irradiation and thus the glass fit is selectively heated without exposing the color filter of the CF substrate 3 and the organic EL elements of the EL substrate 2 to high temperatures.

In addition, the width of the glass frit part subject to the laser irradiation in the drying process and the baking process is narrower than the diameter of the laser beam. Therefore, by simply scanning the laser beam along the glass fit part in a manner described above, the light-shielding part 140 is ensured to be irradiated evenly.

As will be described later in detail, the light-shielding part 140 in contact with the glass frit part is designed to shield a larger amount of light (have a larger light-shielding area) in an inner region than in an outer region. Accordingly, the amount of light passing through the light-shielding part 140 to reach the glass frit part is larger in the outer region. This arrangement serves to improve the strength of bonding between the EL substrate 2 and CF substrate 3 as well as the sealing strength of the glass frit part.

(Features and Effects of Light-Shielding Part 140)

As mentioned above, of the light-shielding part 140, the region 140c overlapping with the glass fit is divided into the inner region 140a and the outer region 140b. The inner region 140a is designed to shield a greater amount of light (i.e. have a larger light-shielding area) than the outer region 140b does.

More specifically, the light-shielding part 140 has portions containing no light-shielding materials and thus allowing light to pass through (hereinafter, may also be referred to as "absent portions", whereas portions in which light-shielding material is present may also be referred to as "actual light-shielding portions. In the inner region 140a of the light-shielding part 140, an area occupied by the absent portions accounts for a smaller percentage as compared with that in the outer region 140b. That is, in the inner region 140a, an area occupied by the actual light-shielding portions accounts for a larger percentage as compared with that in the outer region 140b. Due to this configuration, the inner region 140a has a larger light-shielding area (i.e., the percentage of the area occupied by the actual light-shielding portions per unit area is larger) than that in the outer region 140b.

Hence, the amount of laser light passing through the light-shielding part 140 is made smaller in the inner region 140a than in the outer region 140b.

Note that the percentage of the area occupied by the actual light-shielding portions may be made to differ between the outer region 140b and the inner region 140a simply in two levels or in multiple levels gradually from the outer to inner region. Alternatively, the percentage may vary seamlessly from the outer to inner region.

With reference to FIGS. 6 and 7, the following describe specific examples of the light-shielding part 140 in which the inner region 140a has a larger light-shielding area than the outer region 140b does.

FIGS. 6A and 6B and 7A and 7B are plan views each showing a specific example pattern of the light-shielding part 140.

Figure 6A:
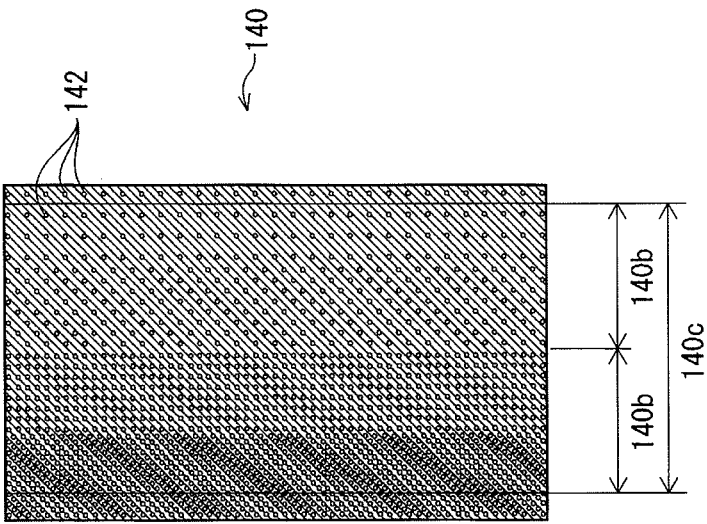
FIGS. 6A and 6B are plan views each showing a specific example pattern of a light-shielding part 140.

In the example shown in FIG. 6A, the light-shielding part 140 is composed of dots 141 distributed. The number of dots 141 arranged per unit area is smaller in the outer region 140b than in the inner region 140a. Hence, the percentage of the light-shielding area (i.e., the percentage the area occupied by actual light-shielding portions (i.e., portions other than absent portions) per unit area of the light-shielding part 140) is larger in the inner region 140a than in the outer region 140b.

Figure 6B:
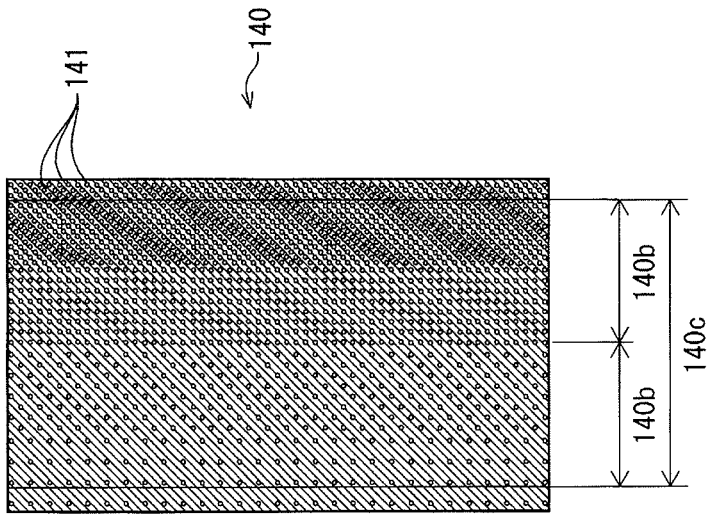

In the example shown in FIG. 6B, the light-shielding part 140 is composed of a sheet having through holes 142 each having a dot-like shape and arranged in a distributed pattern. The number of holes 142 per unit area is larger in the outer region 140b than in the inner region 140a. Hence, the percentage of the light-shielding area is smaller in the outer region 140b than in the inner region 140a.

Figure 7C:
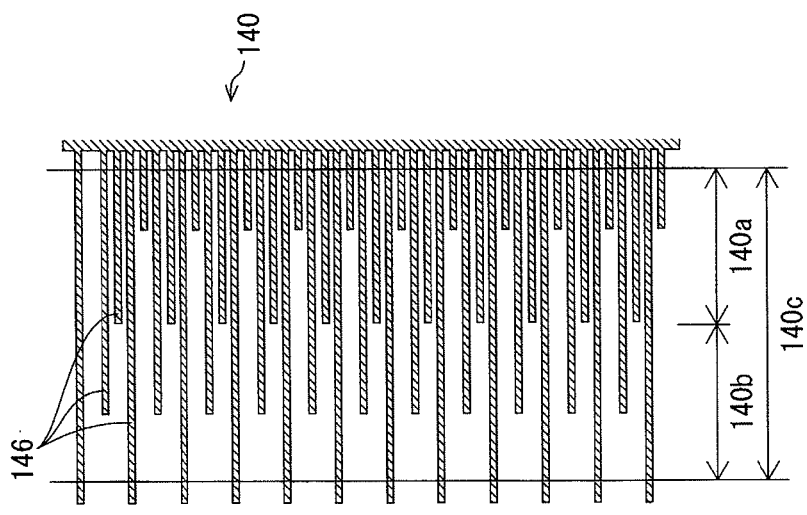
FIGS. 7A-7C are plan views each showing a specific example pattern of the light-shielding part 140.
Figure 7B:
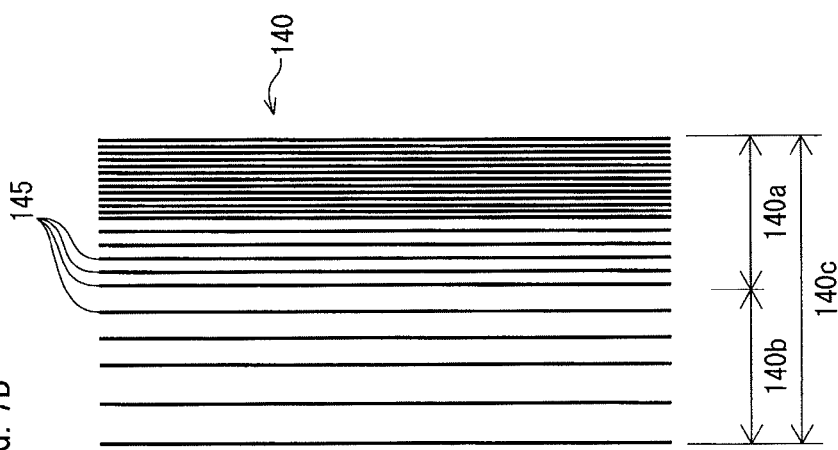
Figure 7A:
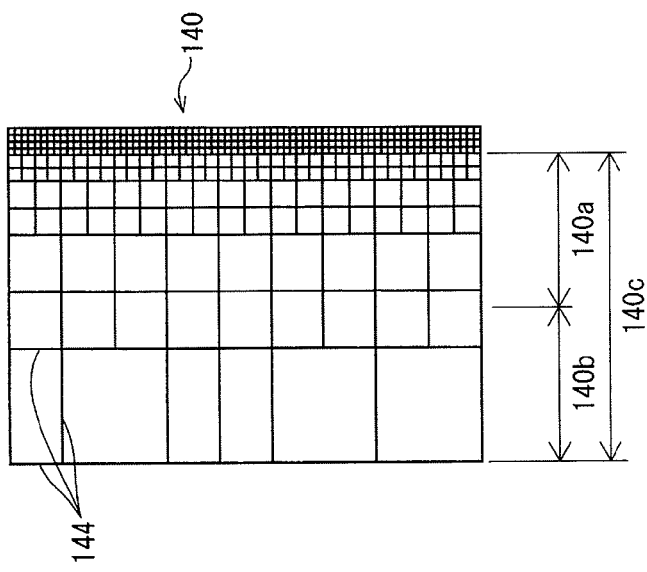

In the example shown in FIG. 7A, the light-shielding part 140 is composed of a sheet formed by strip portions 143 of light-shielding material arranged in a lattice pattern. The number of strip portions per unit area is smaller in the outer region 140b than in the inner region 140a. Hence, the percentage of the light-shielding area in the light-shielding part 140 is smaller in the outer region 140b than in the inner region 140a.

In the example shown in FIG. 7B, the light-shielding part 140 is composed of strip portions 144 of light-shielding material disposed in a striped pattern. The interval between adjacent strip portions 144 is larger in the outer region 140b than in the inner region 140a. Hence, the percentage of the light-shielding area in the light-shielding part 140 is smaller in the outer region 140b than in the inner region 140a.

In the example shown in FIG. 7C, the light-shielding part 140 is composed of tooth portions 146 of light-shielding material disposed to extend from the inner edge of the light-shielding part 140 toward the outer edge to form a comb-like pattern. The tooth portions 146 of the comb-like pattern have variety of lengths. More specifically, the lengths of the tooth portions 146 of the comb-like pattern extending from the inner edge of the light-shielding part 140 are incrementally shorter. The tips of longest tooth portions 146 reach the outer edge of the light-shielding part 140 and the tips of shorter tooth portions 146 are located inside the inner region 140a. Hence, the percentage of the light-shielding area in the light-shielding part 140 is smaller in the outer region 140b than in the inner region 140a.

Due to the presence of the light-shielding part 140 having such a configuration between the glass frit part 120 and the glass substrate 111, when a laser beam is emitted toward the glass frit part 120 from the direction of the glass substrate 111, the amount of light reaching the glass frit part 120 after passing through the light-shielding part 140 is greater at a location corresponding to the region the outer region 140b than to the inner region 140a.

In addition, the presence of the tooth portions 146 extending from the inner edge toward the outer edge as shown in FIG. 7C serves to guide the flow of gas in the case where gas is generated from the glass frit material at the time of drying or baking with laser irradiation. More specifically, gas thus generated is guided along the tooth portions 146 in a direction toward the outer edge and will be released to the outside the glass frit part 120.

In the manner described above, gas flow from the inner region to the outer region of the glass frit is accelerated, which helps to prevent gas from remaining as bubbles within the glass frit.

As described above, the light-shielding part 140 is designed to have a larger light-shielding area in the inner region than in the outer region and this configuration produces the following advantageous effect in the drying process and the baking process.

Note that FIGS. 6A, 6B, 7A, 7B, and 7C show the examples in which the light-shielding area of the light-shielding part 140 decreases in multiple steps. However, the decrease of the light-shielding area may be made simply in two steps (i.e., from the inner region 140*a* to the outer region 140*b*), and this configuration is still able to produces the same advantageous effect.

(Advantageous Effect Produced by Light-Shielding Part 140 in Process of Pre-Baking)

FIG. 8 is a view illustrating the advantageous effect produced by the light-shielding part 140.

In the process of drying glass frit, a laser beam reaches the glass frit paste 120*a* after passing through the light-shielding part 140. As a result, the temperature of the glass frit paste 120*a* rises due to heat received from the laser beam.

Figure 8A:
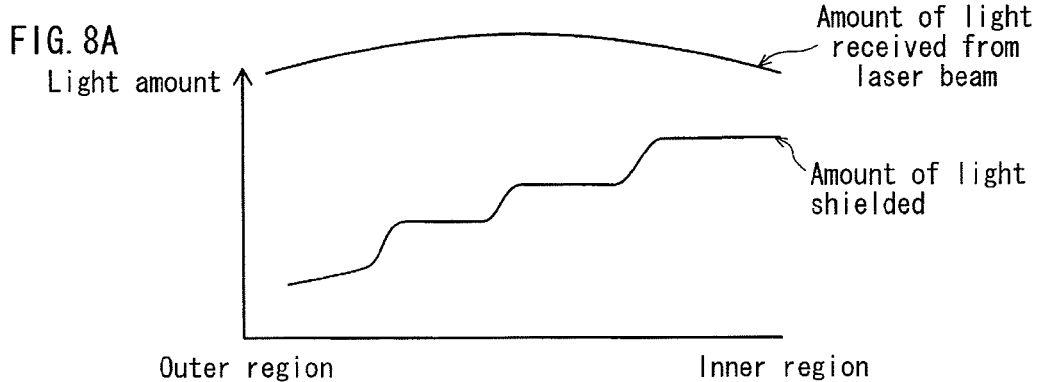
FIGS. 8A-8C are views illustrating the advantageous effect produced by the light-shielding part 140.

Note that the radiation energy of a laser beam is larger at a location near the center of the beam spot than at periphery. Yet, the diameter of the laser beam used herein is larger than the width of the glass frit paste 120*a*. Therefore, as shown in FIG. 8A, the amount of laser beam (amount of energy) directed to the light-shielding part 140 is substantially uniform entirely from the inner region 140*a* to the outer region 140*b*. On the other hand, since the light-shielding area of the light-shielding part 140 is larger in the inner region than in the outer region, the amount of light shielded by the light-shielding part 140 is greater in the inner region 140*a* than in the outer region 140*b*.

That is, the amount of light reaching the glass frit paste 120*a* after passing through the light-shielding part 140 (i.e., the energy density of light received within a predetermined time period) is larger at a location corresponding to the outer region 140*b* than to the inner region 140*a*. Consequently, the temperature of the glass frit paste 120*a* becomes higher in the outer region than in the inner region.

Figure 8B:
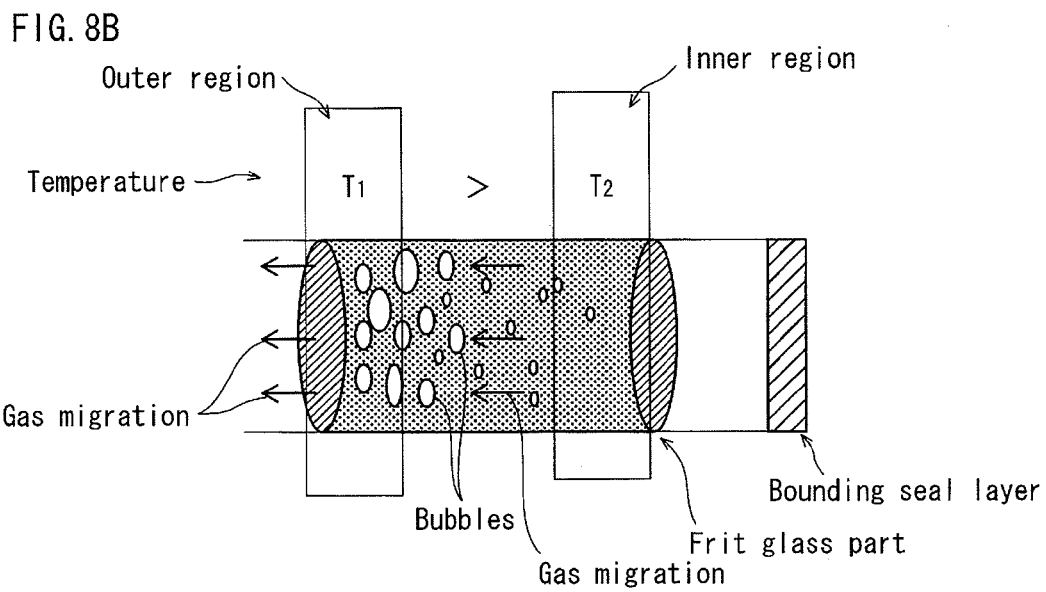

FIG. 8B schematically shows the state of the glass frit part in the process of drying with laser irradiation.

In the process of drying, the glass frit paste is subjected to laser irradiation until the glass fit paste is heated up to 350° C. or so to cause evaporation of the solvent contained in the glass frit part. The amount of light passing through the light-shielding part 140 to reach the glass frit part is larger in the outer region than in the inner region as described above. Thus, as compared to the temperature T1 of the inner region, the temperature T2 of the outer region is higher. Owing to this temperature gradient, solvent contained in the outer region of the glass frit part evaporates before solvent contained in the inner region of the glass frit part.

Note that the glass frit part is left open without being blocked along the outer edge and thus the pressure is lower along the outer edge. Therefore, bubbles of gas evolved in the outer region are released to the outside of the glass frit part.

Subsequently, bubbles evolved in the inner region of the glass fit part move (i.e., migrate) to the outer region of the dried glass frit part 120 to be released to the outside.

In the manner described above, as bubbles evolved in the glass frit part are released to the outside, the glass frit part shrinks toward the inner region. In addition, gas bubbles evolved in the glass frit part tend to escape to the outer region to be released to the outside of the glass frit part, which prevents deterioration of the organic EL elements.

As shown in FIG. 5C, the width of the glass frit part 120 after drying is narrower than that before drying. For example, the width after drying is 1.4 mm.

(Advantageous Effect Produced by Light-Shielding Part 140 in Process of Final-Baking)

Figure 8C:
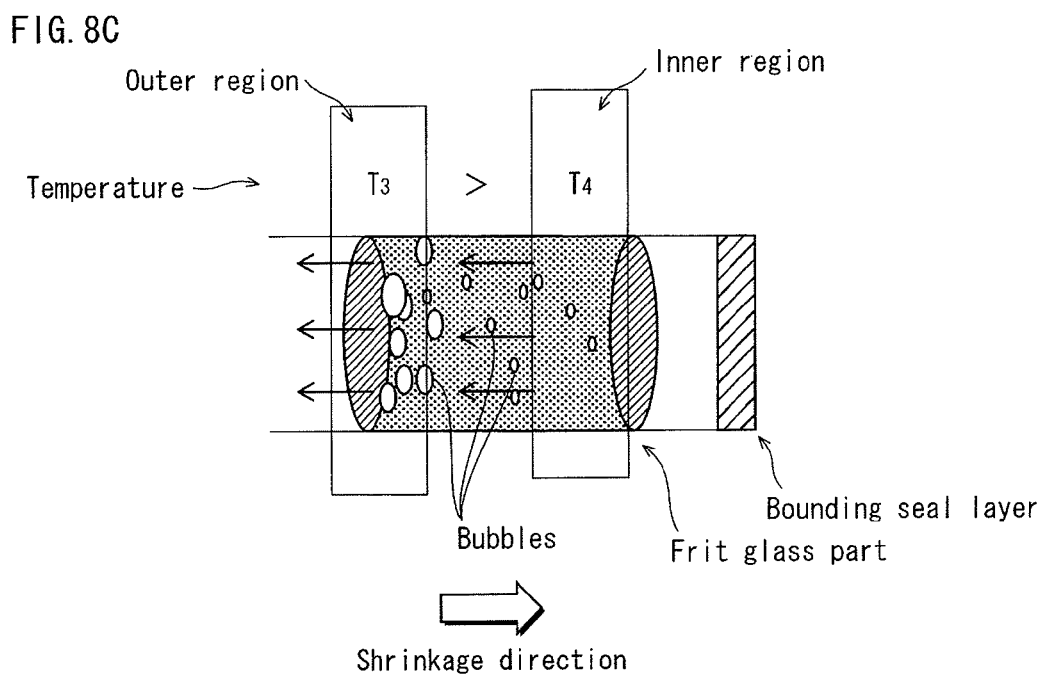

FIG. 8C schematically shows the state of the glass frit part in the process of baking with laser irradiation.

In the process of baking, the glass frit part is subjected to laser irradiation to be heated up to 700° C. at which the glass frit melts. Also in this process, the amount of light passing through the light-shielding part 140 to reach the glass frit part is larger in the outer region than in the inner region. Thus, as compared to the temperature T3 of the inner region, the temperature T4 of the outer region is higher.

In the molten glass frit part, bubbles are generated. Owing to the temperature distribution in the glass frit part, those bubbles generated in the glass frit part during the process of baking escape to the outer region to be released to the outside the glass frit part. Note that the sizes of bubbles generated in the outer region whose temperate is higher are generally larger than those generated in the inner region.

The glass frit heated to melt as described above is then cooled, so that the inner region whose temperature is lower than the outer region solidifies before the outer region. Eventually, the outer region solidifies, while continuously being pulled to the inner region. As described above, when the glass frit is cooled to solidify, the outer region shrinks in the direction toward the inner region as indicated by an open arrow shown in FIG. 8C.

As the glass frit shrinks toward the inner region, bubbles remained in the glass frit part are expelled. Consequently, the residual bubbles are further reduced, which is advantageous for improving the sealing strength of the glass frit part. In addition, an effect of reducing the width of the glass fit part 120 surrounding the display region is produced.

As shown in FIG. 5D, the width of the glass frit part 120 after baking is narrower than that before baking. For example, the width after baking is 1.1 mm.

Note that the volume of bubbles remaining in the glass fit part having been baked is smaller in the inner region than in the outer region.

In addition, the glass frit part having been baked contains some burned product of binder residues (mainly carbon). The amount of such binder residues contained in the glass frit part is greater in the outer region than in the inner region.

Modifications Etc. of Exemplary Embodiment 1

Figure 9:
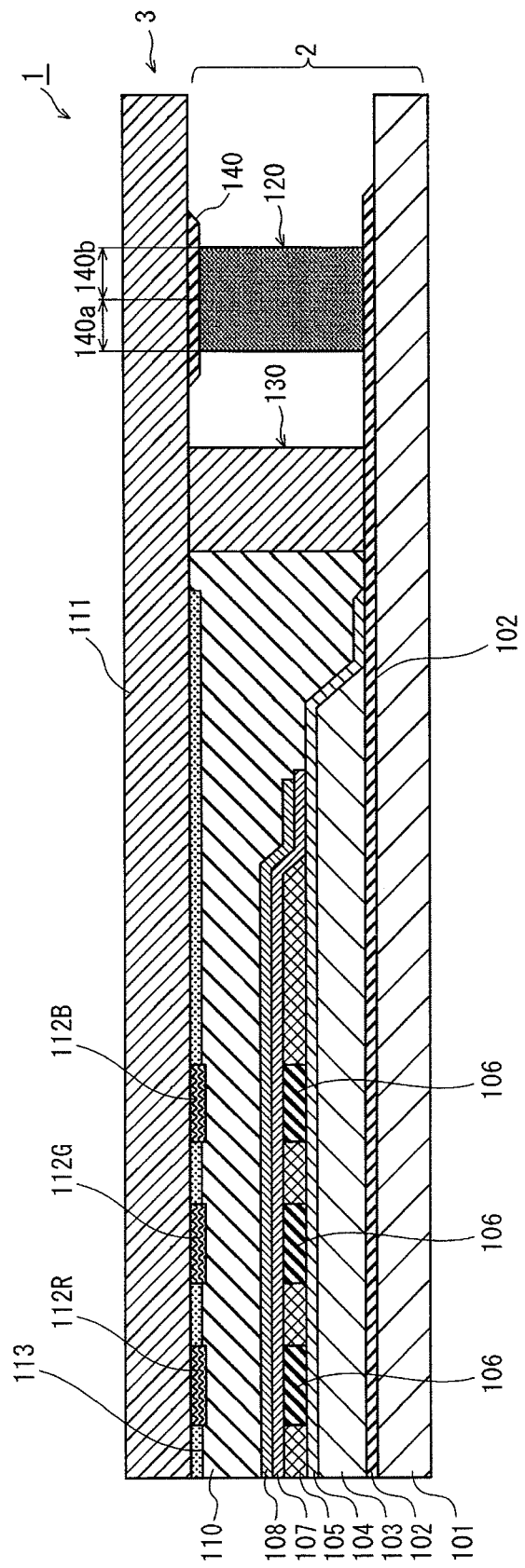
FIG. 9 is a front view of an organic EL display panel according to a modification of the exemplary embodiment 1.

(1) FIG. 9 is a front view of an organic EL display panel 1 according to a modification of the exemplary embodiment 1 of the present disclosure. The structure of the organic EL display panel 1 according to this modification is basically the same as the organic EL display panel 1 according to the exemplary embodiment 1 shown in FIG. 2, except that no thin encapsulating layer 109 is provided on the cathode 108.

The method for manufacturing the organic EL display panel 1 shown in FIG. 9 is basically the same as the manufacturing method described above, except that the process of forming the thin encapsulating layer 109 is not included.

Features of the light-shielding part 140 and the resulting effect of increasing the sealing strength of the glass frit part 120 and the bonding strength between the EL substrate 2 and the CF substrate 3 remain the same as described above.

(2) In the exemplary embodiment 1 described above, the light-shielding part 140 is designed to shield a larger amount of light in the inner region 140*a* than in the outer region 140*b*, so that the glass frit part is caused to receive a greater amount of light at a location corresponding to the outer region 140*b*. Alternatively, the inner region 140*a* and the outer region 140*b* may be manufactured from a different material. More specifically, the inner region 140a may be manufactured from a material having a higher light-shielding property to cause the glass frit part to receive a greater amount of light at a location corresponding to the outer region 140b.

(3) In the manufacturing method according to the exemplary embodiment 1 described above, the light-shielding part 140 is formed on the glass substrate 111 included in the CF substrate 3 and the laser irradiation in the process of prebaking and also in the process of final baking is carried out by directing a laser beam from the direction of the CF substrate 3. Alternatively, the light-shielding part 140 may be formed on the passivation layer 102 that is included in the EL substrate 2 and the laser irradiation may be carried out substantially in the same manner by directing a laser beam from the direction of the EL substrate 2. With this modification, the sealing strength of the glass frit part 120 improves and the bonding strength between the EL substrate 2 and the CF substrate 3 improves in a manner similar to that achieved by the exemplary embodiment 1.

(4) In the exemplary embodiment 1 above, the organic EL display panel 1 has the light-shielding part 140 provided successively along the entire glass frit 120 that surrounds the display region. Although this may be one preferable example, it is not required to provide the light-shielding part 140 along the entire glass frit 120. It is applicable to provide the light-shielding part 140 along a limited portion of the glass frit unit 120.

With such configuration, the effect of improving the sealing strength as well as the bonding strength between the EL substrate 2 and CF substrate 3 is still achieved with respect to each portion of the glass frit part 120 in which light-shielding part 140 is provided.

(5) In the exemplary embodiment 1, the organic EL display panel 1 has the light-shielding part 140 provided on the inner surface of the CF substrate 3 to be in contact with the glass frit 120. Alternatively, however, the light-shielding part may be similarly provided on the outer surface of the CF substrate 3 and still achieves the effect of improving the sealing strength of the glass frit part 120 as well as improving the bonding strength between the EL substrate 2 and CF substrate 3.

(6) According to the exemplary embodiment 1, the light-shielding part 140 is formed on the CF substrate 3. Alternatively, however, the light-shielding part may be formed on a substrate other than the CF substrate 3.

Figure 12:
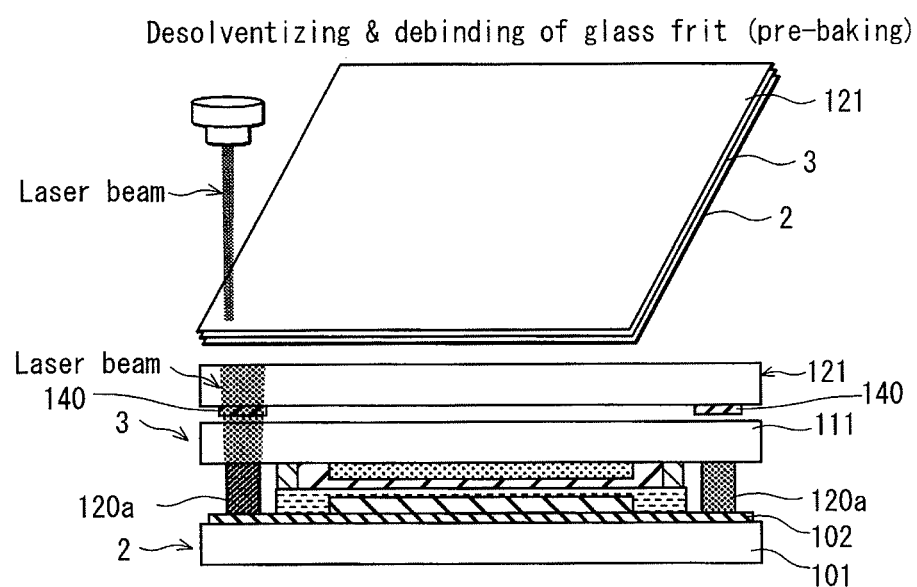
FIG. 12 is a view showing a pre-baking process performed when the light-shielding part is formed on a substrate other than a CF substrate 3.

FIG. 12 is a view showing the pre-baking process when the light-shielding part is formed on a substrate other than the CF substrate 3.

As shown in FIG. 12, the light-shielding part 140 is not provided on the CF substrate 3 but on a transparent substrate 121 along a location corresponding to the glass frit paste 120a.

As described above, the light-shielding part 140 has a larger light-shielding area in the inner region than in the outer region.

Subsequently, the substrate 121 having the light-shielding part 140 is laminated on the CF substrate 3 and the glass frit paste 120a is exposed to a laser beam through the light-shielding part 140. The amount of light passing through the light-shielding part 140 to reach the glass frit paste 120a (i.e., the energy density of light received for a given time period) is greater at a location corresponding to the outer region 140b than to the inner region 140a. Therefore, the above-described advantageous effect achieved by the light-shielding part 140 in the pre-baking process is still ensured.

Similarly to the pre-baking process, the final baking process may be performed by providing the light-shielding part on the substrate 121 rather than the CF substrate 3. With such a final baking process, the above-described advantageous effect achieved by the light-shielding part 140 in the final baking process is still ensured.

(7) In the manufacturing method according to the exemplary embodiment 1, the pre-baking process of the glass frit is performed after the process of joining substrates. Alternatively, however, the pre-baking process of the glass frit may be performed after applying the glass frit paste 120a on the surface of the CF substrate 3 in the glass frit applying process and then the process of joining substrates is performed. In this case, the process of pre-baking is not performed after the process of joining substrates but the process of UV irradiation and thermal curing are performed, followed by the final baking process of glass frit.

The pre-baking process is instead performed for the CF substrate 3 having the glass frit paste 120a applied as shown in FIG. 4A. Note that in the pre-baking process, an oven may be used to heat the CF substrate 3 having the glass frit paste 120a applied thereto. Yet, considering the fact that the color filter is susceptible to thermal deterioration, it may be preferable to use a laser beam to locally heat the glass frit paste 120a applied on the CF substrate 3.

In this case, no temperature gradient is caused in the glass frit paste 120a in the pre-baking process. In the final baking process, however, a laser beam is applied to the glass frit though the light-shielding part 140, so that a temperature gradient is caused in the glass frit paste 120a. Consequently, the advantageous effect achieved by the light-shielding part 140 in the final baking process according to the exemplary embodiment 1 is also achieved according to this modification.

Exemplary Embodiment 2

In the exemplary embodiment 1 described above, the glass frit is subjected to laser irradiation through the light-shielding part 140 in the pre-baking process as well as in the final baking process. In an exemplary embodiment 2, the light-shielding part 140 is not used to cause a temperature gradient in the glass frit. Instead, the spot diameter and path of the laser beam used for irradiating the glass frit is adjusted to cause a temperature gradient in which the temperature of the glass frit is higher in the outer region.

The structure of the EL substrate 2 and the glass frit paste 120a are similar to that described in the exemplary embodiment 1. The CF substrate 3 is also similar to that described in the exemplary embodiment 1, except that no light-shielding part 140 is provided.

In the same manner as described in the exemplary embodiment 1, the process of applying glass frit, the process of joining substrates, and the process of UV irradiation and thermal curing are performed.

FIGS. 13-15 illustrate how to apply a laser beam to the glass frit in the pre-baking process according to the manufacturing method of the exemplary embodiment 2.

Figure 13A:
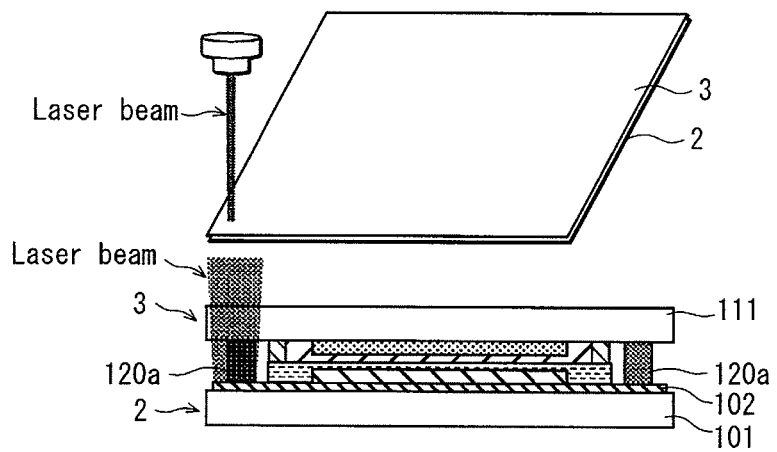
FIGS. 13A-13C are views illustrating a laser beam irradiation step performed in a pre-baking process according to an exemplary embodiment 2.
Figure 13B:
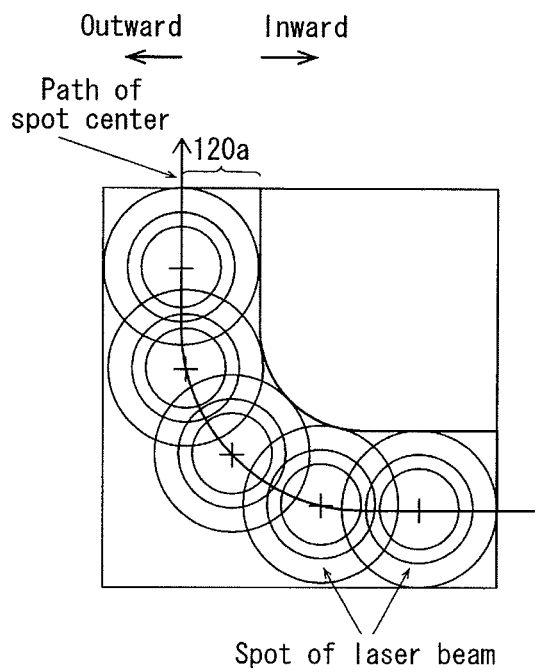
Figure 13C:
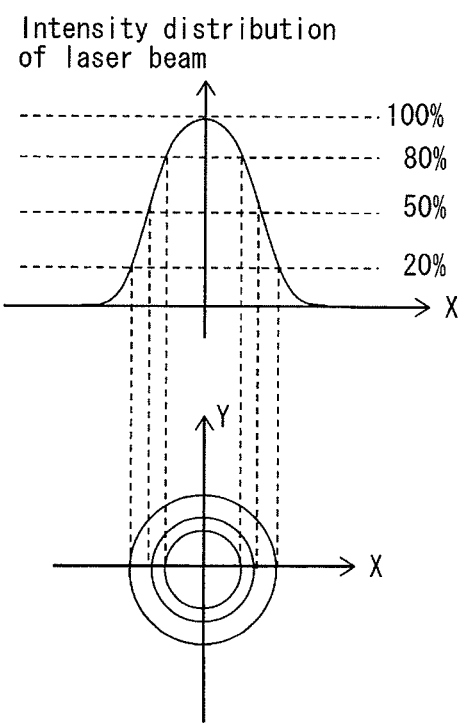

In the example shown in FIGS. 13A, 13B, and 13C, the spot diameter of the laser beam is larger than the width of the glass frit 120a, more specifically about twice the width of the glass frit 120a. As shown in FIG. 13C, the intensity distribution laser beam is in form of a Gaussian intensity profile.

The laser beam is scanned so that the center of the beam spot tracks the outer region of the glass frit 120a. In the example shown in FIG. 13B, the path tracked by the center of the beam spot substantially coincides with the outer edge of the glass frit 120a.

Through the laser irradiation to the glass frit 120a in the manner described above, the glass frit 120a receives a lager energy density in the outer region than in the inner region, while being irradiated by the laser beam through the entire width. Consequently, the outer region of the glass frit 120a is heated to higher temperatures than the inner region.

Figure 14A:
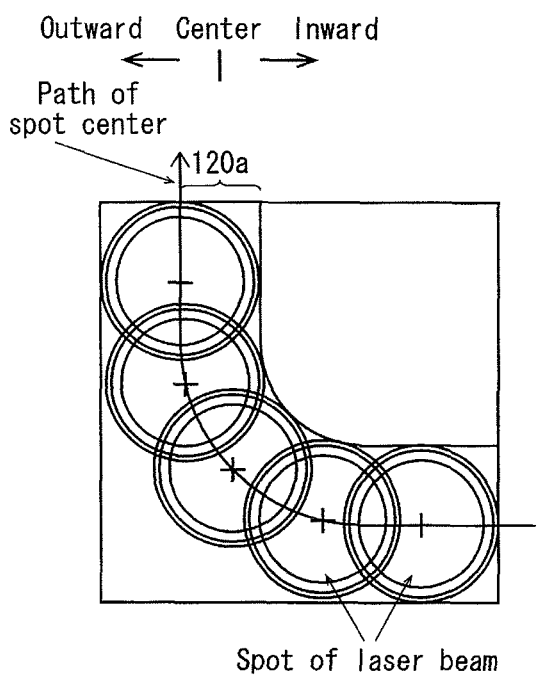
FIGS. 14A-14D are views illustrating a laser beam irradiation step performed in the pre-baking process according to the exemplary embodiment 2.
Figure 14B:
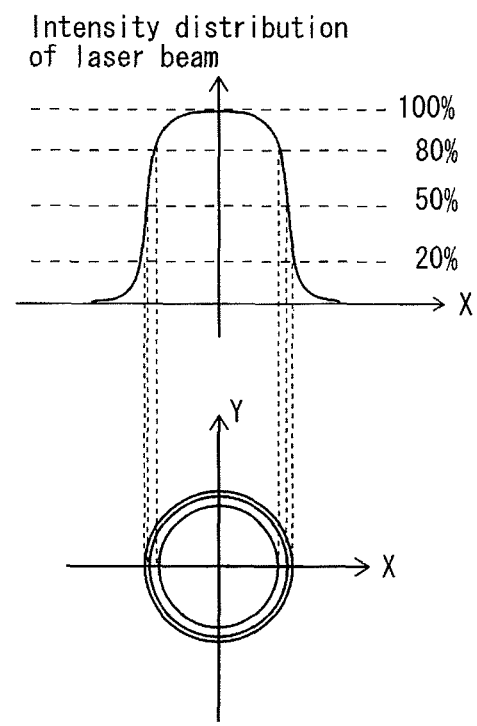

In an example shown in FIGS. 14A and 14B, the spot diameter of a laser beam used is larger than the width of the glass frit 120a, and more specifically about twice the width of the glass frit 120a. In addition, the laser beam is scanned so that the center of the beam spot traces the path substantially coinciding with the outer edge of the glass frit 120a. Yet, the laser beam used in this example does not have a Gaussian profile but a top-hat profile with a flat portion.

Through the laser irradiation to the glass frit 120a in the manner described above, it is also ensured that the glass frit 120a receives a lager energy density in the outer region than in the inner region, while being irradiated by the laser beam through the entire width. Consequently, the outer region of the glass frit 120a is heated to higher temperatures than the inner region.

Figure 14C:
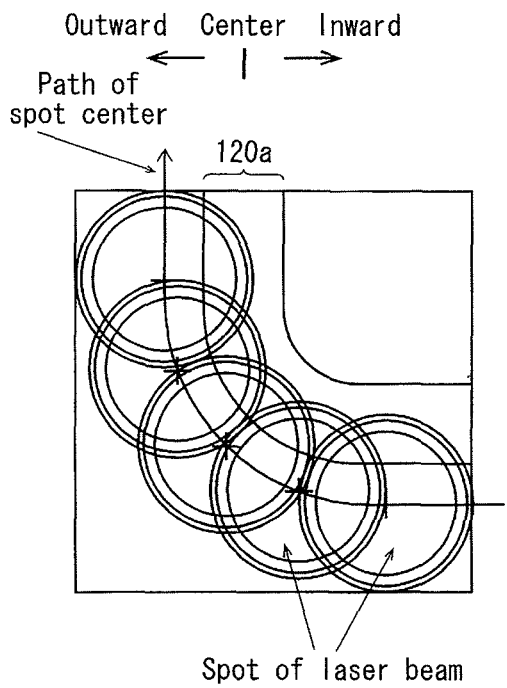
Figure 14D:
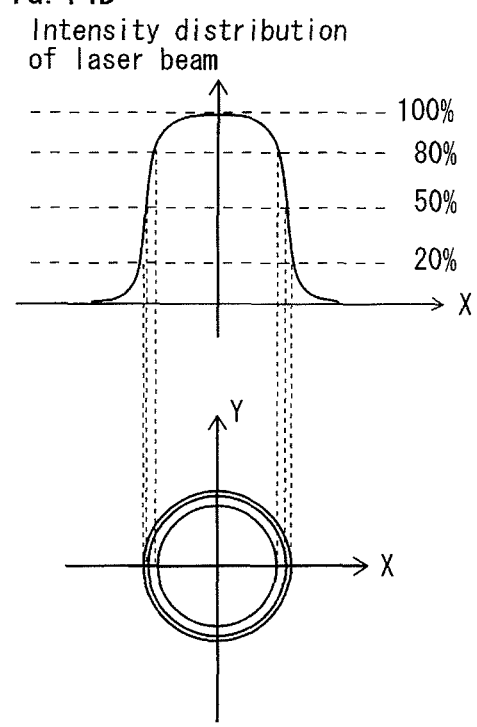

Similarly, in an example shown in FIGS. 14C and 14D, the laser beam used has the intensity distribution having a top-hat profile. Yet, the spot diameter is larger than the size twice the width of the glass frit 120a and the center of the beam spot traces a path outwardly beyond the outer edge of the glass frit 120a.

Through the laser irradiation to the glass frit 120a in the manner described above, it is also ensured that the glass frit 120a receives a lager energy density in the outer region than in the inner region, while being irradiated by the laser beam through the entire width. Consequently, the outer region of the glass frit 120a is heated to higher temperatures than the inner region.

In an example shown in FIGS. 15A-15D, two laser beams having different spot diameters are used in combination.

A laser beam 1 has a spot diameter larger than the width of the glass frit 120a and is scanned so that the center of the beam spot generally traces the widthwise center of the glass frit 120a. On the other hand, a laser beam 2 has a spot diameter smaller than the width of the glass frit 120a and is scanned so that the center of the beam spot traces a path that falls outside the widthwise center of the glass frit 120a. In the example shown in FIG. 15B, the center of the beam spot traces a path that substantially coincides with the outer edge of the glass frit 120a.

In the case where the laser beam 1 and the laser beam 2 are used in combination in laser beam irradiation, the laser beams 1 and 2 may be emitted simultaneously from separate sources or in a time-shifted manner. In the case of time-shifted irradiation, the laser beam 1 and the laser beam 2 may be alternately emitted from one and the same source.

Since the energy density of the laser beam 2 received by the glass frit 120a is larger in the outer region than in the inner region, while the glass frit 120a is irradiated by the laser beam 1 through the entire width. Consequently, through the laser irradiation to the glass frit 120a in the manner described above, the outer region of the glass frit 120a is heated to higher temperatures than the inner region.

As described above, in any examples of laser irradiation shown in FIGS. 13-15, the glass frit 120a is heated such that the temperature of the outer region is higher than the inner region. Hence, as in the effect achieved in the pre-baking process described in the exemplary embodiment 1, bubbles evolved in the glass frit 120a are duly released to the outside and thus the residual volume of bubbles remaining in the glass frit material after drying is reduced. Consequently, the strength of bonding the EL substrate 2 and the CF substrate 3 by the glass frit 120a is ensured to improve.

Up to this point, with reference to FIGS. 13-15, the description is given of ways of laser irradiation to the glass frit in the pre-baking process. In the final baking process, the laser irradiation of glass frit in a similar way achieves the effect that the glass frit 120a receives a higher energy density in the outer region than in the inner region while being irradiated by the laser beam through the entire width. Consequently, the outer region of the glass frit 120a is heated to higher temperatures than the inner region.

Consequently, similarly to the effect achieved by the final baking process described in the exemplary embodiment 1, bubbles remaining in the glass frit are dully released to the outside as the glass frit shrinks toward inside. This further reduces the residual volume of bubbles, which further increase the sealing strength by the glass frit part. In addition, the effect of narrowing the width of the glass frit part 120 surrounding the display region is also achieved.

Exemplary Embodiment 3

General Structure of Panel

Figure 16:
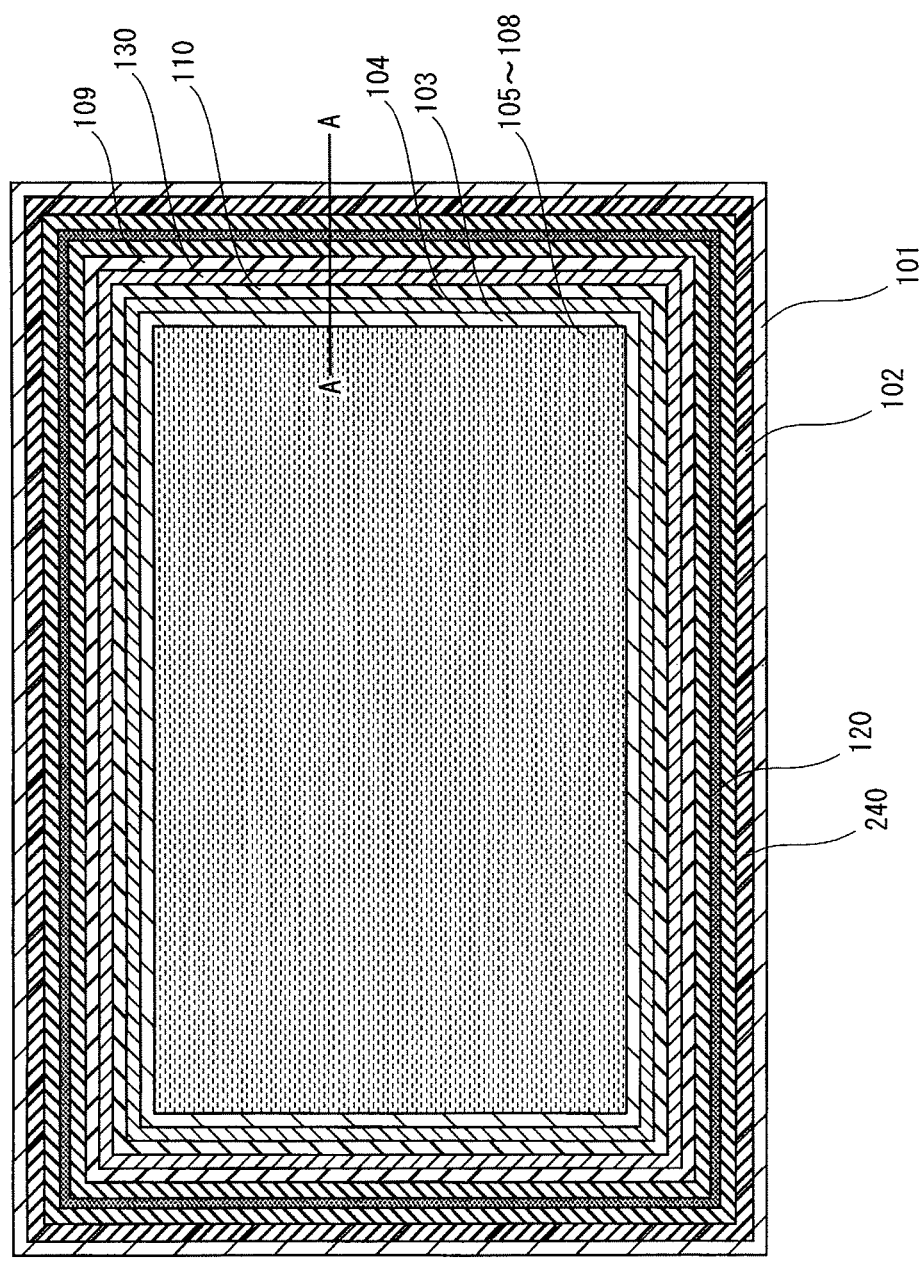
FIG. 16 is a front view showing the structure of an organic EL display panel according to an exemplary embodiment 3.
Figure 17:
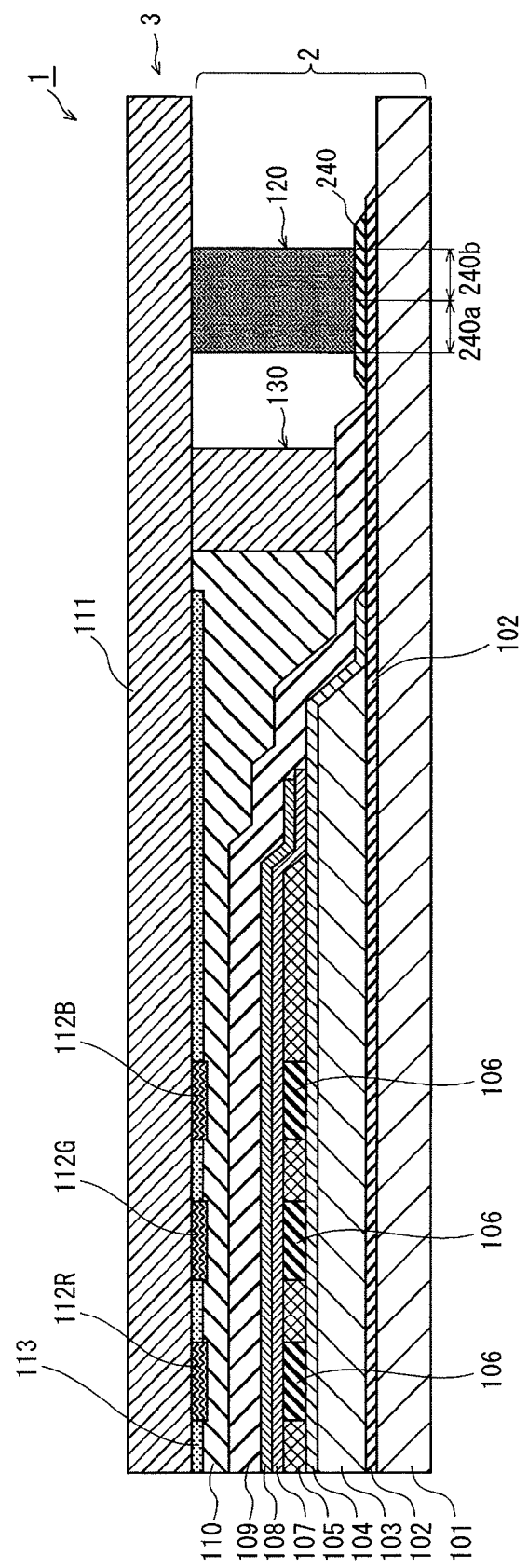
FIG. 17 is a cross sectional view showing the structure of the organic EL display panel.

FIG. 16 is a front view showing the structure of an organic EL display panel according to an exemplary embodiment 3. FIG. 17 is a cross-sectional view showing the structure of the organic EL display panel 1, in particular showing part of the panel taken along line A-A of FIG. 16.

Similarly to the organic EL display panel 1 according to the exemplary embodiment 1, the organic EL display panel 1 according to this exemplary embodiment includes an EL substrate 2 having organic EL elements formed on one main surface thereof, a CF substrate 3 having a color filter and opposed to the each EL substrate 2 with an encapsulating resin layer 110 therebetween. The respective substrates 2 and 3 are sealed together along their edge regions by a glass frit part 120 and a seal part 130.

The EL substrate 2 has a TFT substrate 101 and also has TFTs, a passivation layer 102, a planarizing film 103, an anode 104, banks 105, an ETL 107, a cathode 108, and thin encapsulating layer 109 that are laminated on the surface of the TFT substrate 101 in the stated order. The surface of a hole-injection layer 4 is divided by the banks 105 into a plurality of regions in each of which a light-emitting layer 106 of one of the respective RGB colors is formed. The ETL 107 and the cathode 108 cover the entire display region in a manner to coat the light-emitting layers 106.

The CF substrate 3 has a glass substrate 111 and also has color filters 112(R), 112(G), and 112(B) and a black matrix (hereinafter, "BM") 113 disposed on the lower surface of the glass substrate 111.

<Encapsulating Resin Layer 110, Glass Frit Part 120, and Seal Part 130>

A transparent resin material is densely filled between the CF substrate 3 and the thin encapsulating layer 109 of the EL substrate 2 to form the encapsulating resin layer 110 covering the display region of the organic EL display panel 1.

In addition, the glass frit part 120, as well as the seal part 130, is present between the EL substrate 2 and the CF substrate 3 as shown in FIG. 17 and extends along a peripheral region of the organic EL display panel 1 so as to form a loop surrounding the display region. That is, the display region is surrounded doubly by the glass frit part 120 and the seal part 130.

The structures of the encapsulating resin layer 110, glass frit part 120, and seal part 130 are the same as those described in the exemplary embodiment 1.

Heat-Conducting Layer 240

In addition, a heat-conducting layer 240 is formed on the passivation layer 102 to extend along the glass frit part 120 that extends along the peripheral regions of the organic EL display panel 1. The heat-conducting layer 240 is a thin film of a heat-conducting material defined into an appropriate pattern.

The heat-conducting layer 240 acts as a heat dissipater for releasing heat from the glass frit part 120 and is made of a heat-conducing material not meltable at the softening point of the glass frit part 120. Examples of such a material include metals, such as silicon (Si), aluminum (Al), gold (Au), silver (Ag), copper (Cu), nickel (Ni), chromium (Cr), titanium (Ti), molybdenum (Mo), tungsten (W), zinc (Zn), and stannum (Sn), as well as alloys of one or more of these metals.

As shown in FIGS. 16 and 17, the heat-conducting layer 240 has an elongated shape looped along the peripheral region of the organic EL display panel 1 in a manner to overlap with the glass frit part 120.

The heat-conducting layer 240 is present between the glass frit part 120 and the passivation layer 102 and conducts heat to the passivation layer 102 when the glass frit part is heated to high temperatures. That is, the heat-conducting layer 240 receives heat from the glass frit part 120 to diffuse the heat throughout the heat-conducting layer 240 and also to dissipate the heat to the TFT substrate 101.

The heat-conducting layer 240 is divided in a widthwise direction into an inner region 240a and an outer region 240b, and is configured to dissipate more heat in the inner region 240a than in the outer region 240b. That is, the inner region 240a has a higher heat transfer coefficient than that of the outer region 240b. The details thereof will be described later.

The organic EL display panel 1 described above may be used in the display device 100 shown in FIGS. 10 and 11 in the exemplary embodiment 1 or used in a television system.

<Manufacturing Method of Organic EL Display Panel>

FIGS. 18-20 are views illustrating a manufacturing method of the organic EL display panel 1.

(1) Process of Preparing EL Substrate 2:

To prepare the EL substrate 2 shown in FIG. 18A, TFTs, a passivation layer 102, a planarizing film 103, an anode 104, banks 105, light-emitting layers 106, an ETL 107, a cathode 108, a thin encapsulating layer 109, and a heat-conducting layer 240 are formed on a main surface of a TFT substrate 101.

The material of the passivation layer 102 may be any of silicon nitride (SiN), silicon oxide (SiO), and silicon oxynitride (SiON).

In this example, the passivation layer 102 is a 500-nm-thick silicon nitride (SiN) layer.

The material of the thin encapsulating layer 109 may be any of silicon nitride (SiN), silicon oxide (SiO), and silicon oxynitride (SiON).

The thin encapsulating layer 109 may be a monolayer or a laminate of a plurality of layers.

In this embodiment, the thin encapsulating layer 109 is a 2000-nm-thick SiN layer.

The heat-conducting layer 240 is formed by first forming a thin film of a heat-conducting material by deposition or sputtering, followed by patterning by photolithography. The heat-conducting layer 240 may be of a monolayer or multilayer structure. In the case of a multilayer structure, each layer is basically formed to have the same pattern.

To form the heat-conducting layer 240 having a dual-layer structure, examples of a metal material usable for the first layer includes silicon (Si), aluminum (Al), gold (Au), silver (Ag), copper (Cu), nickel (Ni), chromium (Cr), titanium (Ti), molybdenum (Mo), tungsten (W), zinc (Zn), stannum (Sn), iron (Fe), platinum (Pt), indium (In), vanadium (V), tantalum (Ta), niobium (Nb), palladium (Pd), and cobalt (Co). Among the metal materials listed above, aluminum (Al), silver (Ag), copper (Cu), or gold (Au) may be preferable for its high thermal conductivity, as well as an alloy containing any of the four metals as a main constituent. For the second layer, a metal having a high melting point, such as tungsten (W), tantalum (Ta), molybdenum (Mo) or niobium (Nb), or an alloy thereof may be preferable.

The heat-conducting layer 240 may be formed simultaneously with the anode 104. For example, to form the dual-layered heat-conducting layer 240 simultaneously with the anode 104, the first layer is formed from an Al—Cu alloy with a thickness of 200 nm simultaneously with the anode 104, and then the second layer is formed from tungsten (W) with a thickness of 20 nm. Note that the second layer is formed for the heat-conducting layer 240. That is, the anode 104 has no second layer.

(2) Process of Preparing CF Substrate 3:

To prepare the CF substrate 3 shown in FIG. 18B, a color filter 112 and a BM 113 are formed on the lower surface of a glass substrate 111.

(3) Process of Forming Seal Material (DAM) 130a

As shown in FIG. 18C, an encapsulating resin is applied on the surface of the CF substrate 3 along its peripheral region in a manner to surround the display region.

Examples of the encapsulating resin include an acrylic resin (UV curing), an epoxy resin (UV curing) and an epoxy resin (thermosetting). The viscosity of resin to be applied falls within the range of 100,000 mPa·sec to 1,000,000 Pa·sec.

In this embodiment, a UV curing epoxy resin is used as the encapsulating resin, and spherical silica particles (20 μm in diameter) are contained in the encapsulating resin. The viscosity is 500,000 Pa·sec.

The encapsulating resin is applied using a dispenser to draw a strip that is 500 μm wide and 80 μm high and that forms a closed loop.

(4) Process of Applying Sealing Resin 110a

As shown in FIG. 18D, an encapsulating resin 110a is applied in dots within the display region in the surface of the CF substrate 3.

Examples of the encapsulating resin 110a include an acrylic resin (UV curing), an epoxy resin (UV curing), and an epoxy resin (thermosetting).

In this exemplary embodiment, the manufacturing of a top-emission type organic EL display panel is assumed, so that a UV curing epoxy resin that is colorless transparent and has a reflective index of about 1.6 is used. The viscosity of the resin to be applied is set to fall within the range of 100 mPa·sec to 500 mPa·sec (200 mPa·sec, for example) and applied using a jet dispenser.

The amount of resin applied per drop is set to fall within the range of 0.2 μL to 2.0 μL, and 1.0 μL, for example. The size of each dot of applied encapsulating resin 110a is about 8 mm in diameter and 150 μm in height.

Although having flowability, the resin applied is retained within the region bounded by the seal material 130a.

Note that a thermoplastic sheet may be usable as the encapsulating resin 110a. In that case, the step of forming the seal material 130a may be omitted.

(5) Process of Applying Glass Frit:

As shown in FIG. 19A, a glass frit paste 120a is applied along a peripheral region of the surface of the CF substrate 3.

As described in the exemplary embodiment 1, the glass frit paste 120a is prepared by mixing glass frit (power), spacers, binder, and solvent.

The glass frit paste 120a is adjusted to have the viscosity falling within the range of 100,000 mPa·sec to 1,000,000 mPa·sec (200,000 mPa·sec, for example) and applied with the use of a dispenser to draw a line forming a closed loop on the CF substrate 3 in a manner that the display region is encircled by the line of the applied glass frit paste.

As shown in FIG. 19A, the glass frit paste 120a applied is 700 µm wide and 90 µm high, for example.

(6) and (7) Process of Joining Substrates

As shown in FIGS. 19B and 19C, the CF substrate 3 on which the glass frit paste 120a is applied is placed face to face with the EL substrate 2 and adjusted for proper registration.

Next, the EL substrate 2 and the CF substrate 3 are pressed against each other by, for example, a mechanical press to the extent that the encapsulating resin 110a, the seal material 130a, and the glass frit paste 120 are squeezed under the pressure.

As the encapsulating resin 110a and the glass frit paste 120a are squeezed to spread under the pressing, the gap between the EL substrate 2 and the CF substrate 3 is closed to form a hermetically sealed space that is doubly surrounded by the seal material 130a and the glass frit paste 120a. The encapsulating resin 110a is contained within the hermetically sealed space.

Subsequently, nitrogen is introduced into the vacuum chamber to change the vacuum back to atmospheric pressure, which causes the EL substrate 2 and the CF substrate 3 to be inwardly pressed by even force (the differential pressure between the atmospheric pressure and vacuum). As a result, the substrates 2 and 3 are brought into intimate contact even further. Yet, by the presence of the spacers, the gap between the substrates 2 and 3 is secured to be 20 µm.

By the process of joining substrates described above, the EL substrate 2 and the CF substrate 3 are bonded to each other along their peripheral regions by the seal material 130 and the glass frit paste 120a.

(8) Process of Flipping

The EL substrate 2 and the CF substrate 3 thus joined together are flipped as shown in FIG. 19D.

As shown in FIG. 19C, the seal material 130a after the substrate joining measures 1.5 mm in width and 20 µm in height. This height is equal to the diameter of a spacer, and the distance between the EL substrate 2 and the CF substrate 3 is also fixed to be equal to the spacer's diameter. As shown in FIG. 19D, the glass frit paste 120a measures 2 mm in width and 20 µm in height.

(9) Process of UV Irradiation and Thermosetting:

As shown in FIG. 20A, the entirety of the EL substrate 2 and the CF substrate 3 that are joined together is irradiated with UV light from the direction of the CF substrate 3.

The UV light is with wavelength of 365 nm and the cumulative irradiation of 2J. Upon exposure to UV light, the seal material 130a and the encapsulating resin 110a start to cure. After the irradiation, the joined substrates 2 and 3 are heated at 100° C. for 20 minutes to further promote the curing.

(10) Process of Pre-Baking Glass Frit

As shown in FIG. 20B, the glass frit paste 120a present between the EL substrate 2 and the CF substrate 3 joined together is irradiated with a laser beam through the CF substrate 3 for heating to high temperatures, which are not high enough to cause melting of glass (for example, up to 350° C.). As a result, the solvent and binder evaporate (or sublimate) to complete the pre-baking of the glass frit paste 120a.

Note that the laser beam is directed to the glass frit paste 120a from the direction of the CF substrate 3 which is opposite from the direction of the EL substrate 2 having the heat-conducting layer 240. Therefore, the laser beam reaches the glass frit paste 120a without being shielded by the heat-conducting layer 240.

It is beneficial to use a laser of a suitable wavelength selected to match the adsorption band of the transition metal oxide contained in the glass frit. Reversely, it is beneficial to select glass frit containing a transition metal oxide having the adsorption band matching the wavelength of a laser to be used.

In this example, a semiconductor laser is used as an irradiation source and the laser emits a continuous wave (CW) at the wavelength of 905 nm, laser power of 30 W, and scanning speed of 2.0 mm/sec. In addition the spot diameter $\Phi$ is 3.2 mm, which is larger than the width (2 mm) of the glass frit paste 120a applied. Note that the laser used herein is not limited to a CW laser and may be a pulsed laser. Furthermore, examples of the laser include a YAG laser (wavelength 1064 nm) in addition to a semiconductor laser.

By the presence of the heat-conducting layer 240, a temperature gradient is formed within the glass frit part 120. More specifically, the outer region (highest tempter region) of the glass frit part 120 reaches the temperature of the order of 350° C. and the inner region (lowest temperature region) reaches the temperature of the order of 200° C.

Through the process of pre-baking, the solvent is evaporated and the binder is also sublimated or evaporated from the glass frit paste 120a.

(11) Process of Final Baking Glass Frit

As shown in FIG. 20C, the glass frit part 120 present between the EL substrate 2 and the CF substrate 3 joined together is irradiated with a laser beam through the CF substrate 3 to be heated to temperatures causing the glass to melt (700° C. for example). In this way, the final baking is carried out. Similarly to the pre-baking process described above, the laser beam is directed to the glass frit paste 120a from the direction of the CF substrate 3 which is opposite from the direction of the EL substrate 2 having the heat-conducting layer 240. Therefore, the laser beam reaches the glass frit paste 120a without being shielded by the heat-conducting layer 240.

Similar to the process of drying described above, a semiconductor laser is used as an irradiation source and the laser emits a continuous wave (CW) at the wavelength of 905 nm and the spot diameter $\Phi$ is 3.2 mm. Yet, in this process, the laser power is 90 W and the scanning speed is 10.0 mm/sec.

Note that the laser may be a YAG laser (wavelength 1064 nm).

By the presence of the heat-conducting layer 240, a temperature gradient is formed within the glass frit part 120. More specifically, the outer region (highest tempter region) of the glass frit part 120 reaches the temperature of the order of 800° C. and the inner region (lowest temperature region) reaches the temperature of the order of 500° C.

In this final baking process, the glass frit contained in the glass frit part 120 melts and later solidified to complete the sealing.

(12) Through the above processes, the organic EL display panel 1 as shown in FIG. 20D is completed.

According to the manufacturing method described above, the pre-baking process and the final baking process of the glass frit is performed with laser irradiation. Thus, the glass frit is selectively heated without exposing the color filter of the CF substrate 3 and the organic EL elements of the EL substrate 2 to high temperatures.

In addition, the width of the glass fit part subject to the laser irradiation in both the pre-baking process and the final baking process is smaller than the spot diameter of the laser beam.

Therefore, by simply scanning the laser beam along the glass frit part in a manner described above, heat is applied evenly to the glass frit part.

That is, while the glass frit part is subjected to uniform heat irradiation, the heat-conducting layer 240 provided in contact with the glass frit part dissipates more heat in the inner region than in the outer region as described above. Consequently, the bonding strength between the EL substrate 2 and the CF substrate 3 after baking improves, along with the sealing strength of the glass frit part.

(Feature and Effect of Heat-Conducting Layer 240)

A region 240c of the heat-conducting layer 240 is where the glass frit overlaps. In the region 240c, the inner region 240a is configured to dissipate more heat than the outer region 240b. That is, the heat-conducting layer 240 is configured to allow a greater amount of heat to be conducted through the interface between the inner region 240a and the glass fit part 120 than between the outer region 240b and the glass frit part 120.

More specifically, the heat-conducting layer 240 has portions in which heat-conducting material is absent (hereinafter, referred to as "absent portions", whereas portions in which heat-conducting material is present may also be referred to as "actual heat-conducting portions").

In the inner region 240a of the heat-conducting layer 240, an area occupied by the absent portions accounts for a smaller percentage as compared with that in the outer region 240b. That is, in the inner region 240a, an area occupied by the actual heat-conducting portions accounts for a larger percentage as compared with that in the outer region 240b. Hence, along the interface between the glass frit part 120 and the heat-conducting layer 240, the percentage of the surface that is actually in contact with the glass frit part 120 (i.e., the percentage of the area occupied by portions of the heat-conducting layer that are actually in contact with the glass frit part in the area occupied by portions of the heat-conducting layer that are apparently in contact with the glass frit part) is larger in the inner region 240a than in the outer region 240b. Due to this configuration, the inner region 240a dissipates more heat per unit area than the outer region 240b.

Note that the percentage of the area occupied by portions of the heat-conducting layer that are in contact with the glass frit part 120 may be made to differ between the inner region 240a and the outer region 240b simply in two levels or in multiple levels gradually from the outer to inner region. Alternatively, the percentage may vary seamlessly from the outer to inner region.

With reference to FIGS. 21A-21D, the following describe specific examples of the heat-conducting layer 240 in which the inner region 240a has higher heat dissipation than the outer region 240b.

Figure 21A:
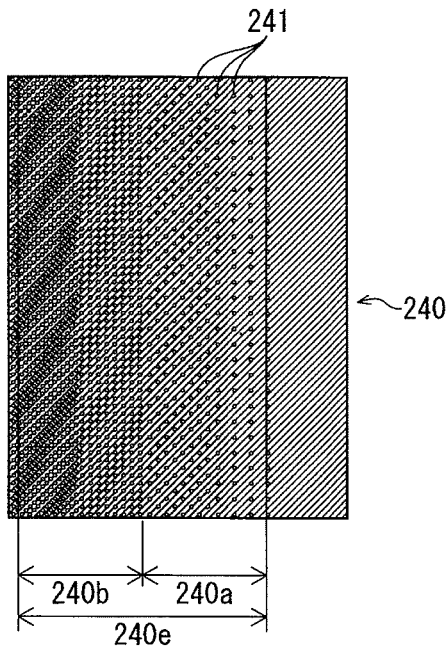
FIGS. 21A-21D are plan views each showing a specific example pattern of a heat-conducting layer 240.
Figure 21B:
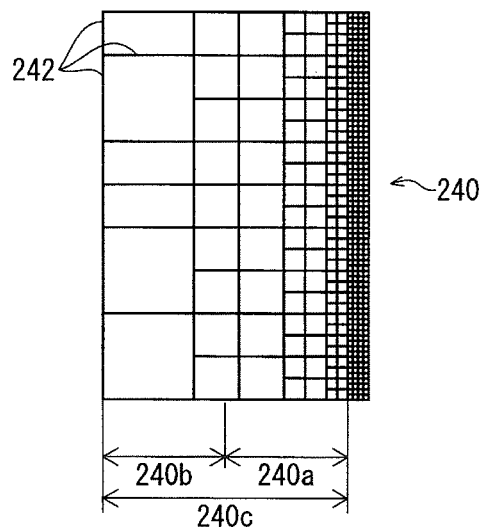
Figure 21C:
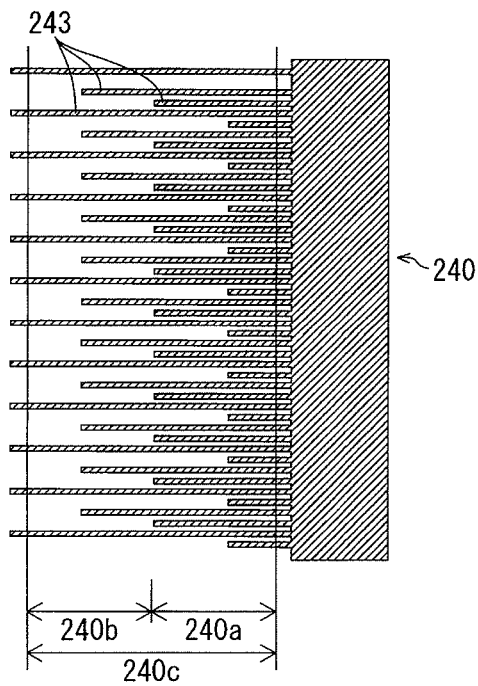
Figure 21D:
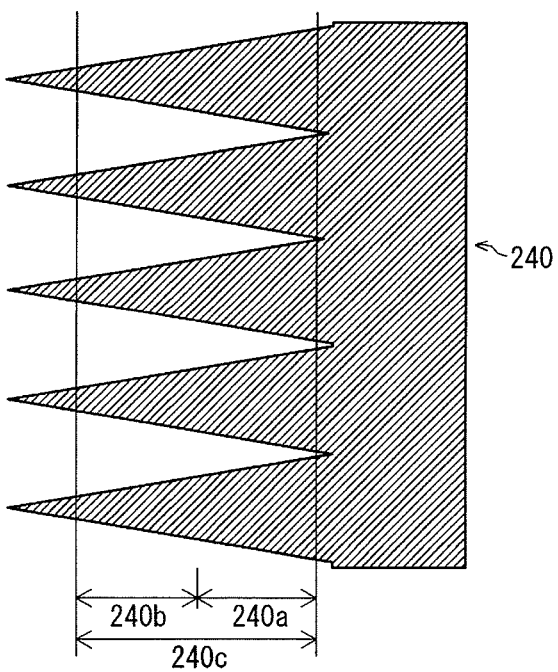

FIGS. 21A and 21D are plan views each showing a specific example pattern of the heat-conducting layer 240.

In the example shown in FIG. 21A, the heat-conducting layer 240 is composed of a sheet having through holes 241 each having a dot-like shape and arranged in a distributed pattern. The number of holes 241 per unit area is smaller in the outer region 240b than in the inner region 240a.

Hence, the percentage of the actual heat-conducting portions (i.e., the percentage of the area occupied by portions of the heat-conducting layer 240 that are actually in contact with the glass frit part 120 (i.e., portions other than the absent portions)) is smaller in the outer region 240b than in the inner region 240a.

In the example shown in FIG. 21B, the heat-conducting layer 240 is composed of a sheet formed by strip portions 242 of heat-dissipating material disposed in a lattice pattern. The number of strip portions 242 of heat-dissipating material per unit area is smaller in the outer region 240b than in the inner region 240a. Hence, the percentage of the contacting area of the heat-conducting layer 240 with the glass frit part 120 is smaller in the outer region 240b than in the inner region 240a.

In the example shown in FIG. 21C, the heat-conducting layer 240 is composed of tooth portions 243 of heat-conducting material disposed to extend from the innermost edge of toward the outermost edge to define a comb-like pattern. The tooth portions 243 of the comb-like pattern have variety of lengths. More specifically, the lengths of the tooth portions 243 of the comb-like pattern extending from the inner edge of the heat-conducting layer 240 are incrementally shorter. The tips of longer tooth portions 243 reach the outer edge of the heat-conducting layer 240 and the tips of shorter tooth portions 243 are located inside the inner region 240a. Hence, the percentage of the contacting area of the heat-conducting layer 240 with the glass frit part 120 is smaller in the outer region 240b than in the inner region 240a.

In the example shown in FIG. 21D, the heat-conducting layer 240 is composed of a plurality of taped portions 244 each extending from an outer edge to toward the outer edge and having a diminishing width toward the outer edge. Hence, the percentage of the contacting area of the heat-conducting layer 240 with the glass frit part 120 is smaller in the outer region 240b than in the inner region 240a.

By the presence of the heat-conducting layer 240 having such a shape between the glass frit part 120 and the passivation layer 102, the amount of heat dissipated to the passivation layer 102 when the glass frit part 120 is heated to high temperatures is greater in the inner region 240a than in the outer region 240b.

In addition, the presence of the tooth portions 243 in a comb-like pattern extending from the inner edge toward the outer edge as shown in FIG. 24C serve to guide the flow of gas generated from the glass frit material at the time of drying or baking of the glass frit with laser irradiation. More specifically, gas thus generated is guided along the tooth portions 243 of a comb-like pattern from the inner region to the outer region and released to the outside the glass frit part 120.

In the manner described above, in the process of heat irradiation, gas flow from the inner region to the outer region of the glass frit is accelerated, which helps to prevent gas from remaining as bubbles within the glass frit.

As described above, the heat-conducting layer 240 is designed to dissipate heat from the glass frit part and the amount of heat dissipated is greater in the inner region than in the outer region, and this configuration produces the following advantageous effect at the time of drying and baking.

Regarding the examples shown in FIGS. 21A-21D, the following should be noted. In the examples shown in FIGS. 21A-21C, the contacting area between the glass frit part 120 and the heat-conducting layer 240 per unit area decreases in multiple steps from the inner region to the outer region. In the example shown in FIG. 21D, the contacting area between the glass frit part 120 and the heat-conducting layer 240 per unit area decreases seamlessly from the inner region to the outer region. Yet, the contacting area may be decreased simply in two steps between the inner region 240a and the outer region 240B and still achieves basically the same advantageous effect.

(Advantageous Effect Produced by Heat-Conducting Layer 240 in Process of Pre-Baking)

FIG. 22 is a view illustrating the advantageous effect produced by the heat-conducting layer 240.

In the process of drying glass frit, the glass frit paste 120a is in contact with the heat-conducting layer 240.

Being radiated with a laser beam, the glass frit paste 120a receives heat from the laser beam and its temperature rises. The heat received from the laser beam is conducted first to the heat-conducting layer 240 and then dissipated to the passivation layer 102 and the TFT substrate 101.

Figure 22A:
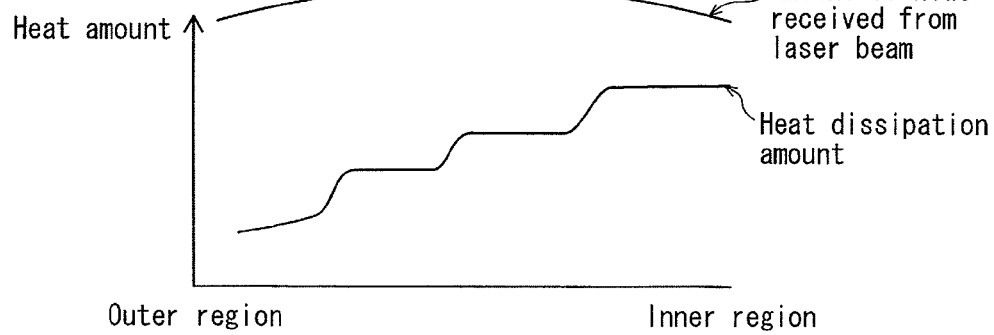
FIGS. 22A-22C are views illustrating the advantageous effect produced by the heat-conducting layer 240.

Note that the radiation energy of the laser beam is larger at a location closer to the center of the beam spot than at a location near the periphery. Yet, since the spot diameter used herein is larger than the width of the glass frit paste 120a, the amount of heat the glass frit paste 120a receives from the laser beam is substantially uniform entirely from the inner region 240a to the outer region 240b, as shown in FIG. 22A. On the other hand, the amount of heat dissipated from the glass frit paste 120a to the heat-conducting layer 240 is made to differ between the inner region 240a and the outer region 240b. More specifically, the larger amount of heat is dissipated to the inner region 240a.

Consequently, the temperature of the glass frit paste 120a becomes lower in the inner region than in the outer region. Since the temperature gradient is formed in the glass frit paste 120a, the following advantageous effect is achieved similarly to that achieved in the pre-baking process according to the exemplary embodiment 1.

Figure 22B:
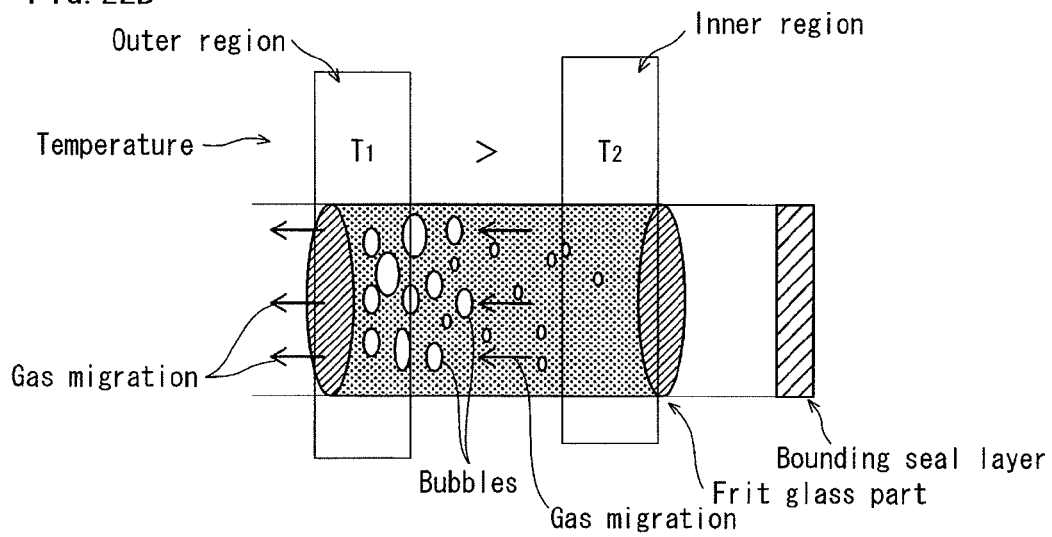

FIG. 22B schematically shows the state of the glass frit part in the process of drying with heat irradiation.

In the drying process, the glass frit paste is heated to the order of 350° C. or so with laser irradiation to evaporate the solvent contained in the glass frit part. At this time, the temperature T1 of the inner region becomes higher than the temperature T2 of the outer region.

Owing to this temperature gradient, solvent contained in the outer region of the glass frit part evaporates before solvent contained in the inner region evaporates. Note that the glass frit part is left open without being blocked along the outer edge and thus the pressure is lower along the outer edge. Therefore, bubbles of gas evolved in the outer region are released to the outside of the glass frit part.

Subsequently, bubbles evolved in the inner region of the glass frit part move to the outer region of the dried glass frit part 120 to be released to the outside.

In the manner described above, as bubbles evolved in the glass frit part are released to the outside, the glass frit part shrinks toward the inner region. In addition, gas bubbles evolved in the glass frit part tend to escape to the outer region to be released to the outside of the glass frit part, which prevents deterioration of the organic EL elements.

As shown in FIG. 20C, the width of the glass frit part 120 after drying is narrower than that before drying. For example, the width after drying is 1.4 mm.

(Advantageous Effect Produced by Heat-Conducting Layer 240 in Process of Final-Baking)

Figure 22C:
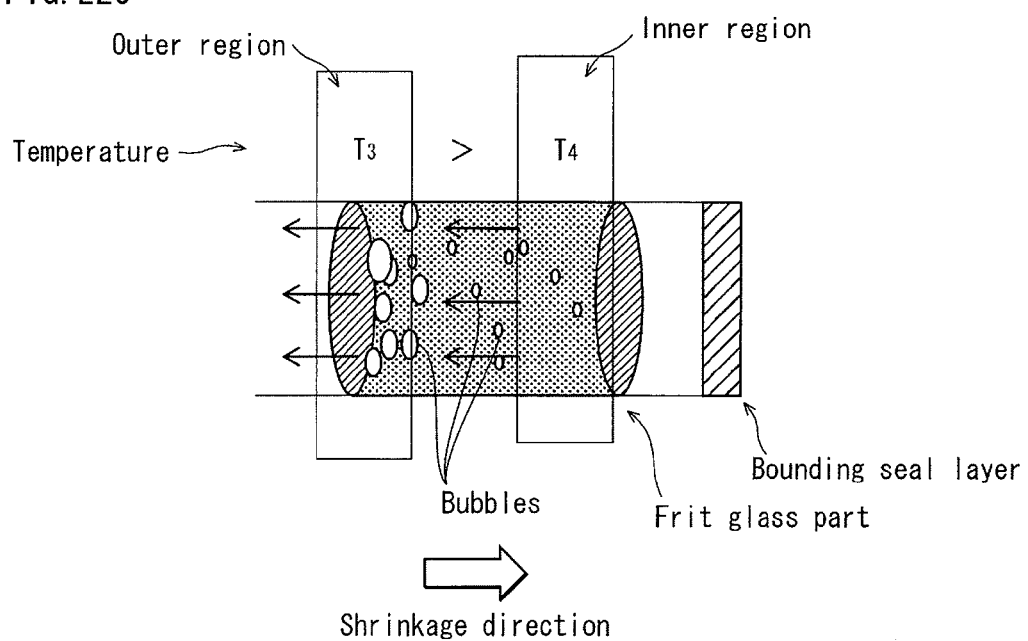

FIG. 22C schematically shows the state of the glass frit part in the process of baking by heating with laser irradiation.

In the process of baking, the glass frit part is subjected to laser irradiation to be heated up to 700° C. to melt the glass frit. Also in this process, the amount of heat released from the glass frit part through the heat-conducting layer 240 is larger in the inner region than in the outer region. Therefore, the temperature T3 of the inner region becomes higher than the temperature T4 in the outer region. Since the temperature gradient is formed in the glass frit part, the following advantageous effect is achieved similarly to that achieved in the final-baking process according to the exemplary embodiment 1.

In the molten glass frit part, bubbles are generated. Owing to the temperature gradient in the glass frit part, those bubbles generated in the glass frit part during the process of baking escape to the outer region to be released to the outside the glass frit part. Note that the sizes of bubbles generated in the outer region whose temperate is higher are generally larger than those generated in the inner region.

The glass frit heated to melt as described above is then cooled, so that the inner region whose temperature is lower than the outer region solidifies before the outer region. Eventually, the outer region solidifies, while continuously being pulled to the inner region. As described above, when the glass frit is cooled to solidify, the outer region shrinks in the direction toward the inner region as indicated by an open arrow shown in FIG. 22C.

As the glass frit shrinks toward the inner region, bubbles remained in the glass frit part are expelled to further reduce the residual bubbles, which is advantageous for improving the sealing strength of the glass frit part. In addition, the effect of narrowing the width of the glass fit part 120 surrounding the display region is also achieved. As shown in FIG. 20D, the width of the glass fit part 120 after baking is narrower than that before baking. For example, the width after baking is 1.1 mm.

Note that the volume of bubbles remaining in the glass frit part having been baked is smaller in the inner region than in the outer region.

In addition, the glass fit part having been baked contains some burned product of binder residues (mainly carbon). The amount of such binder residues contained in the glass frit part is greater in the outer region than in the inner region.

Modifications Etc. of Exemplary Embodiment 3

(1) FIG. 23 is a front view of an organic EL display panel 1 according to a modification of the exemplary embodiment 3 of the present disclosure. The structure of the organic EL display panel 1 according to this modification is basically the same as the organic EL display panel 1 according to the exemplary embodiment 3 shown in FIG. 17, except that no thin encapsulating layer 109 is provided on the cathode 108.

The method for manufacturing the organic EL display panel 1 shown in FIG. 23 is basically the same as the manufacturing method shown described above, except that the process of forming the thin encapsulating layer 109 is not included.

Features of the heat-conducting layer 240 and the resulting effect of increasing the strength of sealing the bonding strength of the EL substrate 2 and the CF substrate 3 by the glass frit part 120 remains the same as described above.

(2) In the exemplary embodiment 3 described above, the heat-conducting layer 240 is designed so that the area in contact with the glass frit part is larger in the inner region 240a than in the outer region 240b. As a consequence, the heat dissipation is larger in the inner region 240a than in the outer region 240b. Alternatively, the inner region 240a and the outer region 240b may be manufactured from a different material. More specifically, the inner region 240a may be manufactured from a material having higher thermal conductivity to have a higher heat dissipation property.

(3) According to the manufacturing method descried in the exemplary embodiment 3, in the pre-baking process as well as in the final baking process, the laser beam is directed to the glass frit part from the direction of the CF substrate 3, which is opposite from the direction of the EL substrate 2 having the heat-conducting layer 240. Alternatively, the laser may be emitted from the direction of the EL substrate 2. However, part of the laser beam emitted from that direction is blocked by the heat-conducting layer 240. Therefore, the laser irradiation from the direction of the CF substrate 3 as described above may be preferable.

(4) According to the exemplary embodiment 3, it is the EL substrate 2 that is provided with the heat-conducting layer 240. Alternatively, however, it may be applicable to provide the CF substrate 3 with a heat-conducting layer similar to the heat-conducting layer 240. With this modification, in the pre-baking or final baking process, the heat-conducting layer thus provided causes a temperature gradient in the glass frit part, so that the effect of increasing the sealing strength of the glass frit part 120 is achieved as well as the effect of increasing the bonding strength between the EL substrate 2 and the CF substrate 3.

Note, however, the heat-conducting layer on the anode EL substrate 2 offers a manufacturing advantage because the heat-conducting layer can be formed simultaneously with the anode as described above.

(5) It may be preferable that the heat-conducting layer 240 continuously extend along the entire glass frit part surrounding the display region, as in the organic EL display panel 1 according to the exemplary embodiment 3. Yet, it is not necessary that the heat-conducting layer 240 be continuously extend along the entire glass fit part and may be provided to extend along a limited portion of the glass fit part 120. With such configuration, the effect of improving the sealing strength as well as bonding strength between the EL substrate 2 and CF substrate 3 is still achieved with respect to each portion of the glass frit part 120 in which the heat-conducting layer 240 are provided.

(6) In the organic EL display panel 1 according to the exemplary embodiment 3, the heat-conducting layer 240 is provided on the inner surface of the EL substrate 2 to be in contact with the glass frit part 120. However, in the case where the EL substrate 2 is relatively thin, the heat-conducting layer may be provided on the outer surface of the EL substrate 2. Such a modification still achieves the effect of increasing the sealing strength of the glass frit part 120 as well as the boning strength between the EL substrate 2 and the CF substrate 3.

(7) In the manufacturing method according to the exemplary embodiment 3, the pre-baking process of glass frit is performed after the process of joining substrates. Alternatively, however, the pre-baking process of the glass frit may be performed after applying the glass frit paste 120a on the surface of the CF substrate 3 in the glass frit applying process and then the process of joining substrates is performed. In this case, the process of pre-baking is not performed after the process of joining substrates but the process of UV irradiation and thermal curing are performed, followed by the final baking process of glass fit.

In this case, no temperature gradient is caused in the glass frit paste 120a in the pre-baking process. In the final baking process, however, a temperature gradient is caused in the glass frit by applying a laser beam to the glass frit, so that the advantageous effect achieved by the heat-conducting layer 240 in the final baking process according to the exemplary embodiment 3 is also achieved according to this modification.

Modifications Etc. of Exemplary Embodiments 1-3

In the manufacturing methods according to the exemplary embodiments 1-3 described above, the laser irradiation of the glass frit is carried out in a manner to cause a temperature gradient in both the pre-baking process and the final baking process. Alternatively, however, it may be sufficient to cause a temperature gradient only by the laser irradiation performed in the pre-baking process. Such a modification still ensures the advantageous effect achieved in the pre-baking process described in the exemplary embodiments 1-3 above.

That is, as long as either of the final baking process or the pre-baking process involves laser irradiation of the glass frit performed in a manner that the energy density is larger in the outer region to cause a temperature gradient, the advantageous effect achieved by the pre-baking or the final baking process described in the exemplary embodiments 1-3 is ensured.

In the exemplary embodiments 1-3 described above, both the pre-baking and the final baking of glass frit are carried out by using laser irradiation. Alternatively, however, rapid thermal annealing (RTA) may be used to carry out the pre-baking and/or the final baking. RTA is also capable of causing the glass frit to have higher temperatures in the outer region than in the inner region. With the temperature gradient, the same advantageous effect is ensured.

The exemplary embodiments 1-3 are all directed to the organic EL display panel 1 which is of a top-emission type. Yet, the same advantageous effect is achieved for an organic EL display panel of a bottom emission type by similarly causing a temperature gradient in the glass frit during the baking process, such that the outer region having higher temperatures than the inner region.

Furthermore, the exemplary embodiments 1-3 described above are directed to the glass frit sealing the organic EL display panel. It is noted, however, that many other types of display panels, such as PDP and FED, also have a pair of substrates having a plurality of light-emitting components disposed between the substrates and sealed along the edges by glass frit. Therefore, with such display devices, the same advantageous effect is achieved by similarly causing a temperature gradient in the glass frit during baking, such that the outer region having higher temperatures than the inner region.

INDUSTRIAL APPLICABILITY

The present disclosure is useful for realizing a thin and high-definition image display device. In particular, in the field of organic EL panels, the present disclosure is particularly useful to realize an organic EL display panel having long life and excellent durability.

REFERENCE SIGNS LIST 1 organic EL display panel
2 EL substrate
3 CF substrate
4 hole-injection layer
101 TFT substrate
102 passivation layer
103 planarizing film
104 anode
105 bank
106 light-emitting layer
107 electron transport layer (ETL)
108 cathode
109 thin sealing layer
110 encapsulating resin layer
110a encapsulating resin
111 glass substrate
120 glass frit part
120a glass frit paste
130 seal part
130a seal material
140 light-shielding part 140a inner region
140b outer region
240 heat-conducting layer
240a inner region
240b outer region

The invention claimed is:

1. A display panel comprising:
   a first substrate;
   a plurality of light-emitting elements disposed on a region of the first substrate;
   a second substrate facing the first substrate with the light-emitting elements therebetween;
   a glass frit present between the first substrate and the second substrate so as to surround the region of the first substrate in which the light-emitting elements are disposed, the glass frit providing a hermetic seal between the first substrate and the second substrate; and
   a light-shielding part formed on one of the first substrate and the second substrate so as to extend along the glass frit, the light-shielding part shielding light, wherein
   the light-shielding part has a lower light-shielding property in a region corresponding to the outer region of the glass frit than in a region corresponding to the inner region of the glass frit.

2. The display panel according to claim 1, wherein
   the glass frit has been heated by irradiating with light, and
   the outer region of the glass frit has received light of a higher energy density than that received by the inner region of the glass frit.

3. The display panel according to claim 1, wherein
   the light-shielding part has a plurality of isolated portions, and
   the portions of the light-shielding part are distributed so that an amount of shielded light is smaller in the region corresponding to the outer region of the glass frit than in the region corresponding to the inner region of the glass frit.

4. The display panel according to claim 1, wherein
   the light-shielding part comprises a sheet having a plurality of through holes, and
   the through holes of the light-shielding part are distributed so that an amount of shielded light is smaller in the region corresponding to the outer region of the glass frit than in the region corresponding to the inner region of the glass frit.

5. The display panel according to claim 1, wherein
   the light-shielding part has a plurality of portions defining a grid pattern, and
   the portions of the light-shielding part are arranged so that an amount of shielded light is smaller in the region corresponding to the outer region of the glass frit than in the region corresponding to the inner region of the glass frit.

6. The display panel according to claim 1, wherein
   the light-shielding part has a plurality of portions each extending in strip form in parallel to a lengthwise direction of the glass frit, and
   the portions of the light-shielding part are spaced at intervals varied so that an amount of shielded light is smaller in the region corresponding to the outer region of the glass frit than in the region corresponding to the inner region of the glass frit.

7. The display panel according to claim 1, wherein
   the light-shielding part has a plurality of tooth portions defining a comb-like pattern, each tooth portion extending outwardly from an inner edge of the light-shielding part to have one of lengths that are incrementally shorter, whereby an amount of light shielded by the light-shielding part is smaller in the region corresponding to the outer region of the glass frit than in the region corresponding to the inner region of the glass frit.

8. The display panel according to claim 7, wherein
   the glass frit present between the first substrate and the second substrate extends to define a rectangle surrounding the region of the first substrate in which the light-emitting elements are disposed, and
   each tooth portion of the light-shielding part extends perpendicular to a lengthwise direction of the glass frit.

9. The display panel according to claim 1, wherein
   a volume of bubbles remaining in the inner region of the glass frit is smaller than a volume of bubbles remaining in the outer region of the glass frit.

10. A display panel comprising:
    a first substrate;
    a plurality of light-emitting elements disposed on a region of the first substrate;
    a second substrate facing the first substrate with the light-emitting elements therebetween;
    a glass frit present between the first substrate and the second substrate so as to surround the region of the first substrate in which the light-emitting elements are disposed, the glass frit providing a hermetic seal between the first substrate and the second substrate; and
    a heat-dissipating part disposed between the glass frit and one of the first substrate and the second substrate, the heat-dissipating part having a higher heat dissipating property in a region corresponding to the inner region of the glass frit than in a region corresponding to the outer region of the glass frit, wherein
    the glass frit has been baked by heating.

11. The display panel according to claim 10, wherein
    the heat-dissipating part comprises a sheet having a plurality of through holes, and
    the through holes are distributed so that an area of the heat-dissipating part in contact with the glass frit is smaller in the outer region of the glass frit than in the inner region of the glass frit.

12. The display panel according to claim 11, wherein
    a volume of bubbles remaining in the inner region of the glass frit is smaller than a volume of bubbles remaining in the outer region of the glass frit.

13. The display panel according to claim 10, wherein
    the heat-dissipating part comprises a heat-dissipating sheet having a plurality of portions defining a grid pattern, and
    the portions of the heat-dissipating part are arranged so that an area of the heat-dissipating part in contact with the glass frit is smaller in the outer region of the glass frit than in the inner region of the glass frit.

14. The display panel according to claim 10, wherein
    the heat-dissipating part has a plurality of tooth portions defining a comb-like pattern, each tooth portion extending outwardly from an inner edge of the heat-dissipating part to have one of lengths that are incrementally shorter, whereby
    an amount of heat dissipated by the heat-dissipating part is larger in a region corresponding to the inner region of the glass frit than in a region corresponding to the outer region of the glass frit.

15. The display panel according to claim 14, wherein
    the glass frit present between the first substrate and the second substrate extends to define a rectangle surrounding the region of the first substrate in which the light-emitting elements are disposed, and each tooth portion of the heat-dissipating part extends perpendicular to a lengthwise direction of the glass frit.

16. The display panel according to claim 10, wherein
the heat-dissipating part has a plurality of tapered portions defining a serrated-outer edge, each tooth portion extending outwardly from an inner edge of the heat-dissipating part and having a diminishing width toward the outer edge, whereby
an amount of heat dissipated by the heat-dissipating part is larger in a region corresponding to the inner region of the glass frit than in a region corresponding to the outer region of the glass frit.

17. A display panel, comprising:
a first substrate;
a plurality of light-emitting elements disposed on a region of the first substrate;
a second substrate facing the first substrate with the light-emitting elements therebetween;
a glass frit present between the first substrate and the second substrate so as to surround the region of the first substrate in which the light-emitting elements are disposed, the glass frit providing a hermetic seal between the first substrate and the second substrate;
a light-shielding part formed on one of the first substrate and the second substrate so as to extend along the glass frit, the light-shielding part shielding; and
a color filter disposed on the second substrate so as to be located between the first substrate and the second substrate, the color filter selectively transmitting a specific color of light emitted from the light-emitting elements and having a glass transition temperature lower than a melting point of the glass frit, wherein
the light-shielding part has a lower light-shielding property in a region corresponding the outer region of the glass frit than in a region corresponding to the inner region of the glass frit, and
the glass frit has been baked by heating.

18. A manufacturing method for a display panel, comprising:
preparing a first substrate;
forming a plurality of light substrate;
preparing a second substrate;
applying a glass frit paste containing a predetermined solvent on one of the first substrate and the second substrate, the glass frit paste being applied to surround, when the first substrate and the second substrate are joined together, the region in which the light-emitting elements are formed;
placing the first substrate and the second substrate face to face across the light-emitting elements; and
heating the glass frit paste applied in the applying of the glass frit paste, wherein
before the glass frit paste is applied, a light-shielding part is disposed on one of the first substrate and the second substrate to surround, when the first substrate and the second substrate are joined together, the region in which the light-emitting elements are formed, the light-shielding part has a lower light-shielding property in a region corresponding to the outer region of the glass frit paste than in a region corresponding to the inner region of the glass frit paste;
in the applying of the glass frit paste, the glass frit paste is applied along the light-shielding part; and
in the heating of the glass frit paste:
the glass frit paste is heated by irradiation of heat to cause a temperature gradient such that a temperature of the glass frit paste is higher in an outer region of the glass frit paste than in an inner region of the glass frit paste; and
the glass frit paste present between the first substrate and the second substrate is irradiated to evaporate the solvent from the glass frit paste.

19. The manufacturing method according to claim 18, wherein
in the heating of the glass frit paste, the light irradiation is carried out by irradiating with a laser beam, and
the irradiated laser beam reaches the glass frit paste through the light-shielding part.

20. The manufacturing method according to claim 18, wherein
a width of the glass frit paste applied in the applying of the glass frit paste is narrower than a width of light irradiated onto the glass frit paste in the heating of the glass frit paste.

21. The manufacturing method according to claim 18, wherein
a width of the glass frit paste applied in the applying of the glass frit paste is narrower than a width of light irradiated onto the glass frit paste in the heating of the glass frit paste.

22. The manufacturing method according to claim 18, wherein
by the light irradiation in the heating of the glass frit paste, the solvent contained in the glass frit paste evaporates so that the outer region of the glass frit paste dries before the inner region of the glass frit paste,
at a time when the solvent contained in the glass frit paste evaporates from the outer region before evaporation from the inner region, bubbles evolved in the glass frit paste escape to the outer region of the glass frit paste, and
the glass frit paste dries in a state where the outer region is pulled toward the inner region.

23. The manufacturing method according to claim 22, further comprising:
baking, after the heating of the glass frit paste, the glass frit paste by irradiating the glass frit paste with heat so that the outer region reaches a higher temperature than the inner region, the glass frit paste subjected to the baking being present between the first substrate and the second substrate and having been dried as a result of evaporation of the solvent.

24. The manufacturing method according to claim 23, wherein in the baking, a glass frit material remaining after the evaporation of the solvent from the glass frit paste bakes so that an inner region of the glass frit material bakes before an outer region of the glass frit material,
at a time when the inner region of the glass frit material bakes before the outer region of the glass frit material, bubbles evolved in the glass frit material escape to the outer region of the glass frit material, and
the glass frit material dries in a state where the outer region is pulled toward the inner region.

25. The manufacturing method according to claim 23, wherein a width of the glass frit paste applied in the applying of the glass frit paste is narrower than a width of heat irradiated onto the glass frit paste in the baking.

26. The manufacturing method according to claim 23, wherein
in the baking, a glass frit material remaining after the evaporation of the solvent from the glass frit paste bakes so that an inner region of the glass frit material bakes before an outer region of the glass frit material, at a time when the inner region of the glass frit material bakes before the outer region of the glass frit material, bubbles evolved in the glass frit material escape to the outer region of the glass frit material, and the glass frit material dries in a state where the outer region is pulled toward the inner region.

27. The manufacturing method according to claim 23, wherein a width of the glass frit paste applied in the applying of the glass frit paste is narrower than a width of heat irradiated onto the glass frit paste in the baking.

28. The manufacturing method according to claim 22, further comprising:

baking, after the heating of the glass frit paste, the glass frit paste by irradiating the glass frit paste with heat so that the outer region reaches a higher temperature than the inner region, the glass frit paste subjected to the baking being present between the first substrate and the second substrate and having been dried as a result of evaporation of the solvent.

29. A manufacturing method for a display panel, comprising:

preparing a first substrate;

forming a plurality of light substrate;

preparing a second substrate;

applying a glass frit paste containing a predetermined solvent on one of the first substrate and the second substrate, the glass frit paste being applied to surround, when the first substrate and the second substrate are joined together, the region in which the light-emitting elements are formed;

placing the first substrate and the second substrate face to face across the light-emitting elements; and heating the glass frit paste applied in the applying of the glass frit paste, wherein before the glass frit paste is applied, a heat-dissipating part is disposed on one of the first substrate and the second substrate so as to surround, when the first substrate and the second substrate are joined together, the region in which the light-emitting elements are formed, the heat-dissipating part having a higher heat-dissipating property in an inner region of the heat-dissipating part than in an outer region of the heat-dissipating part, in the applying of the glass frit paste, the glass frit paste containing the predetermined solvent is applied along the heat-dissipating part, and in the heating of the glass frit paste, the glass frit paste is heated by irradiation of heat to cause a temperature gradient such that a temperature of the glass frit paste is higher in an outer region of the glass frit paste than in an inner region of the glass frit paste.

30. The manufacturing method according to claim 29, wherein in the heating of the glass frit paste, the heat irradiation is carried out by irradiating with a laser beam, and the laser irradiation is carried out by directing the laser beam to the glass frit paste from a direction opposite to the heat-dissipating part.

31. The manufacturing method according to claim 29, wherein by the light irradiation in the heating of the glass frit paste, the solvent contained in the glass frit paste evaporates so that the outer region of the glass frit paste dries before the inner region of the glass frit paste, at a time when the solvent contained in the glass frit paste evaporates from the outer region before evaporation from the inner region, bubbles evolved in the glass frit paste escape to the outer region of the glass frit paste, and the glass frit paste dries in a state where the outer region is pulled toward the inner region.

* * * * *